United States Patent
Kikai et al.

(10) Patent No.: US 11,049,739 B2
(45) Date of Patent: Jun. 29, 2021

(54) ASHING APPARATUS, ASHING METHOD AND RECORDING MEDIUM

(71) Applicant: Tokyo Electron Limited, Tokyo (JP)

(72) Inventors: Takaya Kikai, Koshi (JP); Yuzo Ohishi, Koshi (JP)

(73) Assignee: TOKYO ELECTRON LIMITED, Tokyo (JP)

(*) Notice: Subject to any disclaimer, the term of this patent is extended or adjusted under 35 U.S.C. 154(b) by 173 days.

(21) Appl. No.: 16/260,342

(22) Filed: Jan. 29, 2019

(65) Prior Publication Data

US 2019/0237346 A1 Aug. 1, 2019

(30) Foreign Application Priority Data

Jan. 29, 2018 (JP) .............................. JP2018-012256

(51) Int. Cl.
  *H01L 21/67* (2006.01)
  *H01L 21/3105* (2006.01)
  *H01L 21/311* (2006.01)
  *H01L 21/687* (2006.01)

(52) U.S. Cl.
  CPC .. *H01L 21/67115* (2013.01); *H01L 21/31058* (2013.01); *H01L 21/31138* (2013.01); *H01L 21/67248* (2013.01); *H01L 21/68742* (2013.01)

(58) Field of Classification Search
  CPC combination set(s) only.
  See application file for complete search history.

(56) References Cited

U.S. PATENT DOCUMENTS

| 9,972,740 B2* | 5/2018 | Chae | H01L 21/67161 |
| 2011/0180402 A1* | 7/2011 | Kurata | H01L 29/7869 |
| | | | 204/298.23 |
| 2014/0154887 A1* | 6/2014 | Trivedi | H01L 21/3086 |
| | | | 438/703 |

FOREIGN PATENT DOCUMENTS

JP 2016-027617 A 2/2016

* cited by examiner

*Primary Examiner* — Mounir S Amer
(74) *Attorney, Agent, or Firm* — Pearne & Gordon LLP

(57) ABSTRACT

An ashing apparatus includes a light irradiating unit configured to irradiate, to a substrate having an organic film formed on a surface thereof, processing light for ashing the organic film; a posture changing unit configured to change a posture of the substrate with respect to the light irradiating unit; and a control unit. The control unit performs: a first processing of controlling the posture changing unit and the light irradiating unit to irradiate the processing light to the surface of the substrate while changing the posture of the substrate from a first posture to a second posture; and a second processing of controlling, after the first processing, the posture changing unit and the light irradiating unit to irradiate the processing light to the surface of the substrate while changing the posture of the substrate from a third posture different from the first posture to a fourth posture.

9 Claims, 26 Drawing Sheets

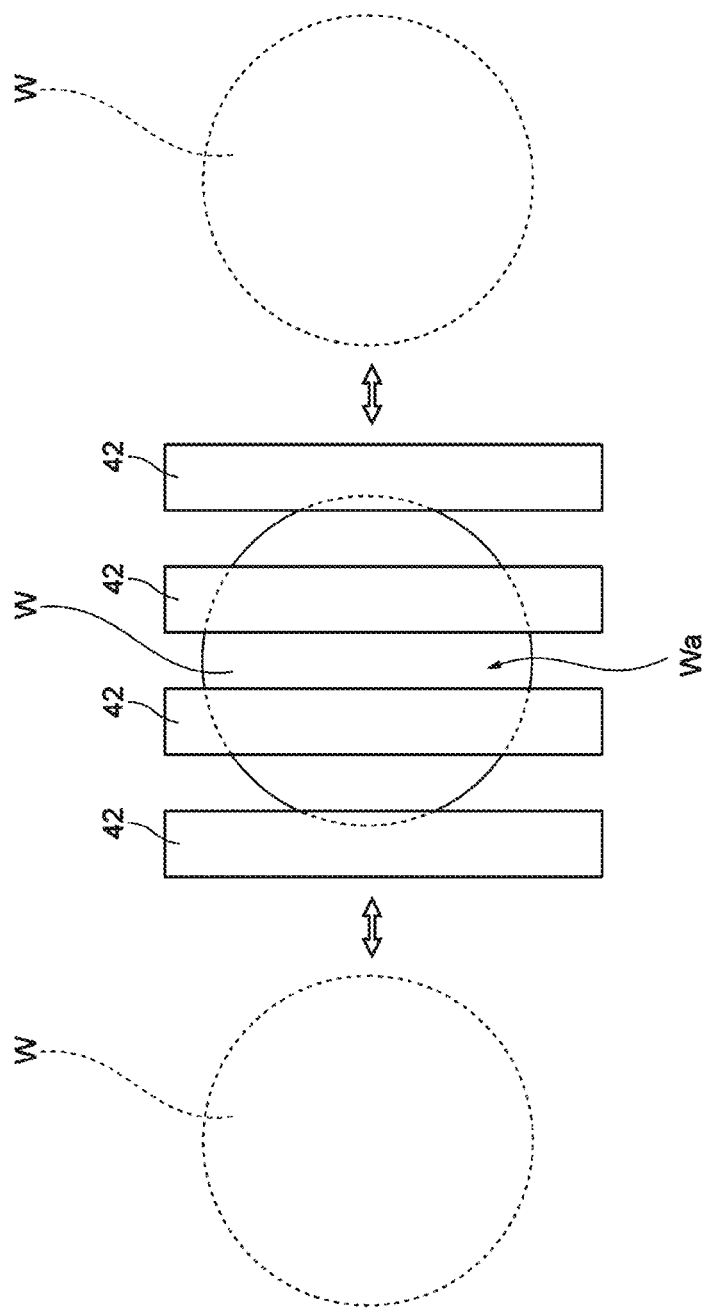

ASHING APPARATUS, ASHING METHOD AND RECORDING MEDIUM

CROSS-REFERENCE TO RELATED APPLICATION

This application claims the benefit of Japanese Patent Application No. 2018-012256 filed on Jan. 29, 2018, the entire disclosures of which are incorporated herein by reference.

TECHNICAL FIELD

The various aspects and embodiments described herein pertain generally to an ashing apparatus, an ashing method and a computer-readable recording medium.

BACKGROUND

Patent Document 1 discloses a substrate processing method. In this method, a substrate having a processing target film formed thereon is placed in a processing chamber under an oxygen-containing atmosphere having a gas flow velocity equal to or less than 10 cm/sec, and a part of an organic film is removed by irradiating an ultraviolet ray to the substrate.

Patent Document 1: Japanese Patent Laid-open Publication No. 2016-027617

SUMMARY

Exemplary embodiments provide an ashing apparatus, an ashing method and a computer-readable recording medium capable of improving, when ashing an organic film formed on a surface of a substrate, uniformity in a film removal amount by the ashing within the surface of the substrate.

Example 1

In an exemplary embodiment of an ashing apparatus, an ashing apparatus includes a light irradiating unit configured to irradiate, to a substrate having an organic film formed on a surface thereof, processing light for ashing the organic film; a posture changing unit configured to change a posture of the substrate with respect to the light irradiating unit by driving at least one of the substrate or the light irradiating unit; and a control unit. The control unit performs: a first processing of controlling the posture changing unit and the light irradiating unit to irradiate the processing light to the surface of the substrate from the light irradiating unit while changing the posture of the substrate with respect to the light irradiating unit from a first posture to a second posture; and a second processing of controlling, after the first processing, the posture changing unit and the light irradiating unit to irradiate the processing light to the surface of the substrate from the light irradiating unit while changing the posture of the substrate with respect to the light irradiating unit from a third posture different from the first posture to a fourth posture.

Through researches by the present inventors, however, it is found out that the beginning of the operation of the irradiating unit is not stable. That is, immediately after the processing light from the irradiating unit is turned on, there may exist some non-uniformity until the processing light comes into a normal state. For this reason, if the substrate is always at the same posture when the turning-on of the irradiating unit is begun, an adverse influence caused by the non-stable beginning of the operation of the irradiating unit may be concentrated to a preset place of the substrate. Specifically, the ashing may not progress sufficiently at this preset place of the substrate, and there may be caused non-uniformity in the film removal amount of the protective film. According to the ashing apparatus of Example 1, however, in the first processing and the second processing performed subsequently, the postures of the substrate are all different whenever the turning-on operation of the irradiating unit is begun. Therefore, the adverse influence caused by the non-stable beginning of the operation of the irradiating unit is suppressed from being concentrated to the preset place of the substrate. Therefore, when ashing the organic film formed on the front surface of the substrate, the uniformity in the film removal amount by the ashing within the surface of the substrate can be improved.

Example 2

In another exemplary embodiment of the ashing apparatus, an ashing apparatus includes a light irradiating unit configured to irradiate, to a substrate having an organic film formed on a surface thereof, processing light for ashing the organic film; a posture changing unit configured to change a posture of the substrate with respect to the light irradiating unit by driving at least one of the substrate or the light irradiating unit; and a control unit. The control unit performs: a first processing as an initial processing of controlling the posture changing unit and the light irradiating unit to irradiate the processing light to the surface of the substrate from the light irradiating unit while moving the substrate with respect to the light irradiating unit at a first speed; and a second processing as a subsequent processing of controlling, after the first processing, the posture changing unit and the light irradiating unit to irradiate the processing light to the surface of the substrate from the light irradiating unit while moving the substrate with respect to the light irradiating unit at a second speed lower than the first speed.

So far, it is believed that the film removal amount by the ashing remains substantially same regardless of a lapse of time. According to researches by the present inventors, however, it is found out that the film removal amount by the ashing is largest at the beginning of the ashing processing and gradually decreases with a lapse of a processing time. According to the ashing apparatus of Example 2, the moving speed of the substrate in the first processing as the initial processing is set to be higher than the moving speed of the substrate in the second processing as the subsequent processing. Accordingly, in the initial processing in which the film removal amount per unit time (hereinafter, sometimes referred to as "removing rate") is large, a larger area of the substrate is ached. Therefore, concentration of the adverse influence in the initial processing to the preset place of the substrate can be suppressed. As a result, when ashing the organic film formed on the surface of the substrate, it is possible to improve the uniformity in the film removal amount by the ashing within the surface of the substrate.

Example 3

In the ashing apparatus of Example 2, the second processing comprises: irradiating the processing light to the surface of the substrate from the light irradiating unit while changing the posture of the substrate with respect to the light irradiating unit from a first posture to a second posture at the second speed; and irradiating the processing light to the surface of the substrate from the light irradiating unit while changing the posture of the substrate with respect to the light irradiating unit from a third posture different from the first posture to a fourth posture at the second speed. In this case, in the second processing as the subsequent processing, the same effect as that of Example 1 is achieved.

Example 4

In the ashing apparatus of any one of Examples 1 to 3, the posture changing unit may be configured to rotate the substrate.

Example 5

In the ashing apparatus of Example 4, a rotation number of the substrate in the first processing may be set to be in a range from 1 rpm to 100 rpm. In this case, in the first processing, the substrate is rotated at a relatively high rotation number. In the first processing, the removing rate tends to be high, as compared to that of the second processing. Thus, in the first processing where the removing rate is relatively high, a larger area of the substrate is ached. Hence, the uniformity in the film removal amount by the ashing within the surface of the substrate can be further improved.

Example 6

The ashing apparatus of any one of Examples 1 to 5 may further include a distance changing unit configured to change a gap between the substrate and the light irradiating unit. The control unit controls the distance changing unit to set a size of the gap in the second processing to be different from a size of the gap in the first processing. In case that an oxygen-containing gas continuously flows around the substrate in the ashing processing, the smaller the gap is, the more difficult it is for the gas to flow in the gap, so that the removing rate tends to be decreased. Meanwhile, the larger the gap is, the easier it is for the gas to flow in the gap, so that the removing rate tends to be increased. In view of this, by setting the gap to be smaller in the first processing where the removing rate tends to be large as compared to that of the second processing, the uniformity in the film removal amount by the ashing within the surface of the substrate can be further improved. Further, if the flow of the oxygen-containing gas is not generated around the substrate in the ashing processing, the larger the gap is, the more difficult it is for the processing light to reach the substrate from the irradiating unit. As a result, the removing rate tends to be reduced. Meanwhile, the smaller the gap is, the easier it is for the processing light from the irradiating unit to reach the substrate, so that the removing rate tends to be increased. Thus, by setting the gap to be larger in the first processing in which the removing rate tends to be high as compared to that of the second processing, the uniformity in the film removal amount by the ashing within the surface of the substrate can be further improved.

Example 7

In the ashing apparatus of any one of Examples 1 to 6, the control unit may further perform a third processing of controlling the light irradiating unit to turn-on, when a preset time elapses after the processing light from the light irradiating unit is turned off, the light irradiating unit such that the processing light is not irradiated to the surface of the substrate, and then, irradiate the processing light to the surface of the substrate. In this case, the processing light from the light irradiating unit is irradiated to the surface of the substrate after a temperature of the light irradiating unit is stabilized. Therefore, a variation of the removing rate that may be caused by a temperature variation of the light irradiating unit is suppressed. Thus, it is possible to further improve the uniformity in the film removal amount by the ashing within the surface of the substrate. Further, if a preset time period supposed to elapse after the light irradiating unit is turned off is previously known, the light irradiating unit may be turned on before the preset time passes by. In such a case, by turning off the processing light again within a predetermined time immediately before the third processing to allow the uniformity in the film removal amount within the surface of the substrate to fall within an allowable range, it is possible to achieve both improvement of the uniformity in the film removal amount within the surface of the substrate and the reduction of the power consumption caused by the turning-on operation of the light irradiating unit.

Example 8

In an exemplary embodiment of an ashing method, an ashing method includes a first process of irradiating, to a surface of a substrate having an organic film formed on the surface thereof, processing light for ashing the organic film from a light irradiating unit while changing a posture of the substrate with respect to the light irradiating unit from a first posture to a second posture; and a second process of irradiating, after the first process, the processing light to the surface of the substrate from the light irradiating unit while changing the posture of the substrate with respect to the light irradiating unit from a third posture different from the first posture to a fourth posture. In this case, the same effect as that of the ashing apparatus of Example 1 is achieved.

Example 9

In another exemplary embodiment of the ashing method, an ashing method includes a first process as an initial process of irradiating, to a surface of a substrate having an organic film formed on the surface thereof, processing light for ashing the organic film from a light irradiating unit while moving the substrate with respect to the light irradiating unit at a first speed; and a second process as a subsequent process of irradiating, after the first process, the processing light to the surface of the substrate from the light irradiating unit while moving the substrate with respect to the light irradiating unit at a second speed lower than the first speed. In this case, the same effect as that of the ashing apparatus of Example 2 is achieved.

Example 10

In the ashing method of Example 9, the second process may include irradiating the processing light to the surface of the substrate from the light irradiating unit while changing a posture of the substrate with respect to the light irradiating unit from a first posture to a second posture at the second speed; and irradiating the processing light to the surface of the substrate from the light irradiating unit while changing the posture of the substrate with respect to the light irradiating unit from a third posture different from the first posture to a fourth posture at the second speed. In this case, the same effect as that of the ashing apparatus of Example 3 is achieved.

Example 11

In the ashing method of any one of Examples 8 to 10, the substrate may be rotated with respect to the light irradiating unit. In this case, the same effect as that of the ashing apparatus of Example 4 is achieved.

Example 12

In the ashing method of Example 9, a rotation number of the substrate in the first process may be set to be in a range from 1 rpm to 100 rpm. In this case, the same effect as that of the ashing apparatus of Example 5 is achieved.

Example 13

In the ashing method of any one of Examples 8 to 12, a gap between the substrate and the light irradiating unit in the second process may be set to be different from the gap between the substrate and the light irradiating unit in the first process. In this case, the same effect as that of the ashing apparatus of Example 6 is achieved.

Example 14

The ashing method of any one of Examples 8 to 13 may further include a third process of turning-on, when a preset time elapses after the processing light from the light irradiating unit is turned off or when a temperature of the light irradiating unit after the processing light from the light irradiating unit is turned off is equal to or less than a preset value, the light irradiating unit such that the processing light is not irradiated to the surface of the substrate, and then, irradiating the processing light to the surface of the substrate. In this case, the same effect as that of the ashing apparatus of Example 7 is achieved.

Example 15

There is provided a computer-readable recording medium having stored thereon computer-executable instructions that, in response to execution, cause an ashing apparatus to perform the ashing method as described in any one of Examples 8 to 14. In this case, the same effect as that of the ashing method of any one of Examples 8 to 14 is achieved. In the present disclosure, the computer-readable recording medium includes a non-transitory computer recording medium (e.g., various kinds of main memory devices or auxiliary memory devices) and a transmission signal (transitory computer recording medium) (e.g., a data signal that can be provided via a network).

According to the ashing apparatus, the ashing method and the computer-readable recording medium of the present disclosure, when ashing the organic film formed on the surface of the substrate, the uniformity in the film removal amount by the ashing within the surface of the substrate can be improved.

The foregoing summary is illustrative only and is not intended to be any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

FIG. 19 is a top view schematically illustrating a state in which the wafer is moved with respect to the light source;

DETAILED DESCRIPTION

Figure 1:
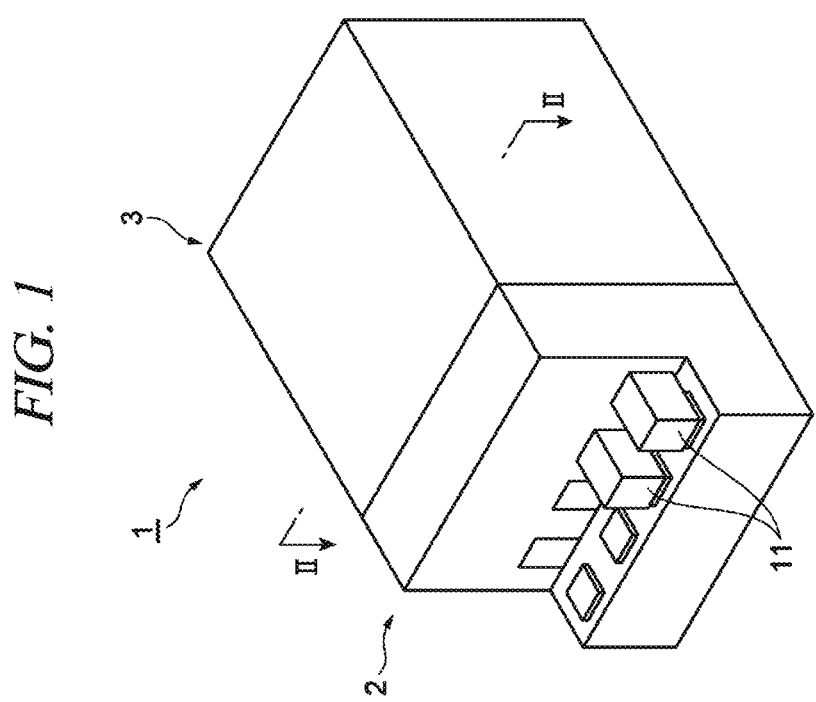
FIG. 1 is a perspective view illustrating a substrate processing system.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

It should be noted once again that the exemplary embodiments of the present disclosure are nothing more than examples, and the present disclosure is not limited to the following description. In the following description, parts having same elements or same functions will be assigned same reference numerals, and redundant description will be omitted.

[Configuration of Substrate Processing Apparatus]

Figure 2:
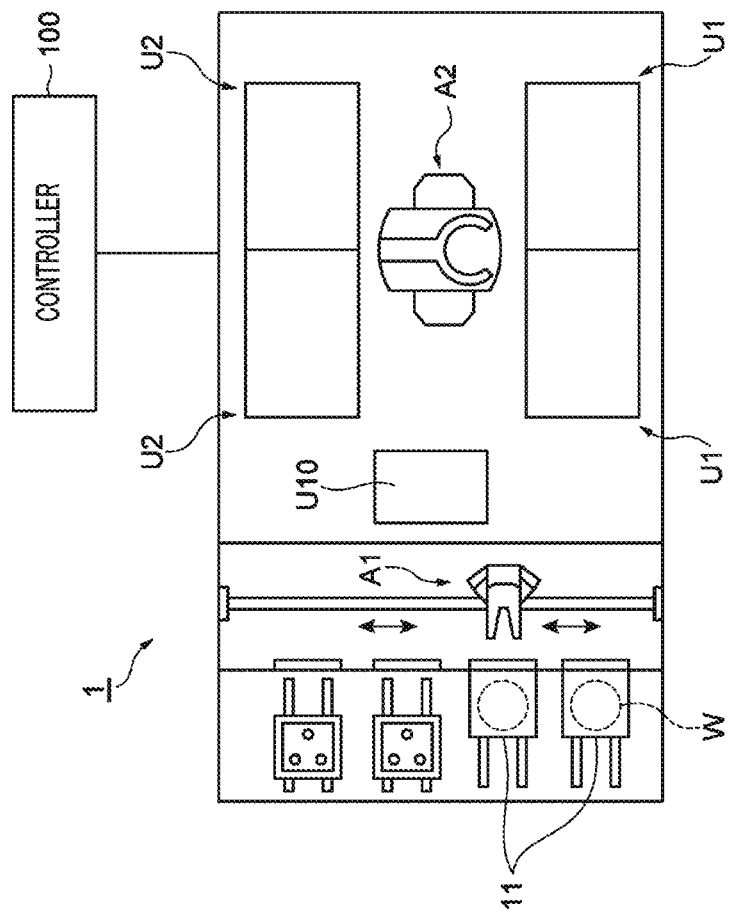
FIG. 2 is a cross sectional view taken along a line II-II of FIG. 1.

A configuration of a substrate processing apparatus 1 will be explained with reference to FIG. 1 and FIG. 2. The substrate processing apparatus 1 is configured to perform a processing of forming a coating film on a surface of a substrate by coating the surface of the substrate with a coating liquid of an organic material, a processing of hardening the coating film by heat treatment to use the coating film as a protective film (organic film) and a processing of smoothing a surface of the protective film by an aching processing. The substrate as a processing target may be, by way of example, but not limitation, a semiconductor wafer W. The protective film may be a hard mask of, by way of non-limiting example, spin on carbon (SOC). The substrate processing apparatus 1 includes: a carrier block 2 and a processing block 3 adjacent to each other; and a controller 100 (control unit).

The carrier block 2 performs a carry-in of the wafer W into the substrate processing apparatus 1 and a carry-out of the wafer W from the substrate processing apparatus 1. For example, the carrier block 2 is capable of supporting a plurality of carriers 11 for wafers W, and is equipped with a transfer arm A1 as shown in FIG. 2. Each carrier 11 accommodates therein a multiple number of, for example, circular wafers W. The transfer arm A1 takes out a wafer W from the carrier 11, delivers the taken wafer W into the processing block 3, receives the wafer W from the processing block 3 and returns the received wafer W back into the carrier 11.

The processing block 3 includes a plurality of liquid processing units U1, a plurality of ashing units U2 (ashing apparatuses) and a transfer arm A2 configured to transfer the wafer W into these units. Each liquid processing unit U1 is configured to perform a processing (coating processing) of forming an organic film by supplying a processing liquid for hard mask formation onto a surface of the wafer W. Each ashing unit U2 is configured to perform a heat treatment for turning the coating film into a hard mask and a processing (ashing processing) of removing a protective film partially by ashing. Within the processing block 3, a shelf unit U10 is provided at the side of the carrier block 2. The shelf unit U10 is composed of a multiple number of cells arranged in the vertical direction.

The controller 100 controls the carrier block 2 and the processing block 3 to perform the coating processing, the heat treatment and the ashing processing upon the wafer W. For example, the controller 100 first controls the transfer arm A1 to transfer the wafer W within the carrier 11 into the shelf unit U10. Then, the controller 100 controls the transfer arm A2 to transfer the wafer W of the shelf unit U10 into the liquid processing unit U1, and controls the liquid processing unit U1 to perform the coating processing on the wafer W. Thereafter, the controller 100 controls the transfer arm A2 to transfer the wafer W from the liquid processing unit U1 into the ashing unit U2, and controls the ashing unit U2 to perform the heat treatment and the ashing processing on the wafer W. Subsequently, the controller 100 controls the transfer arm A2 to transfer the wafer W from the ashing unit U2 into the shelf unit U10, and controls the transfer arm A1 to return the wafer W from the shelf unit U10 back into the carrier 11. Through these operations, the coating processing, the heat treatment and the ashing processing upon the single wafer W are completed.

[Configuration of Ashing Unit]

Figure 3:
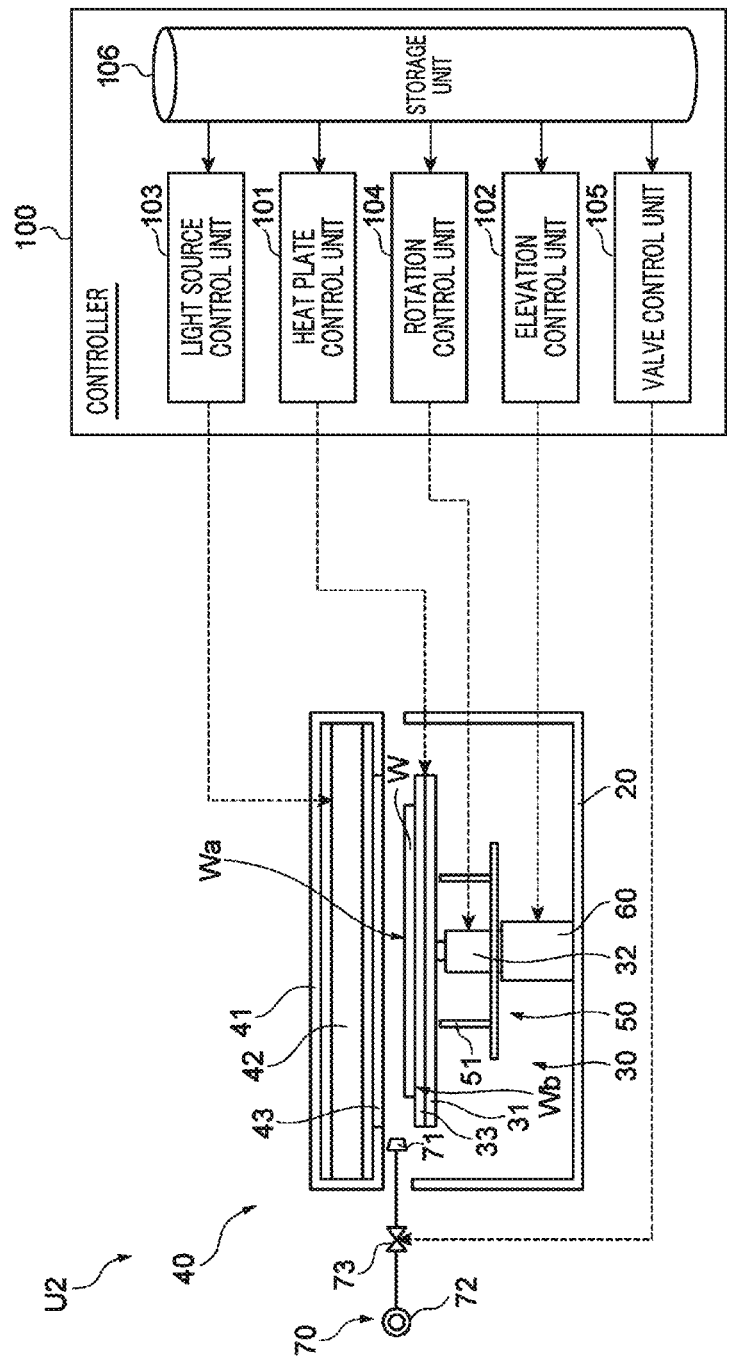
FIG. 3 is a diagram schematically illustrating a configuration of an ashing unit.

Now, a configuration of the ashing unit U2 will be explained with reference to FIG. 3 to FIG. 7. As shown in FIG. 3, the ashing unit U2 includes a housing 20, a rotating/holding unit 30 (posture changing unit), a light irradiating unit 40, a supporting unit 50, a distance changing unit 60 and an oxygen supplying unit 70.

The housing 20 accommodates therein some constituent components of the ashing unit U2. By way of example, the housing 20 accommodates therein the rotating/holding unit 30, the supporting unit 50 and the distance changing unit 60.

Figure 4:
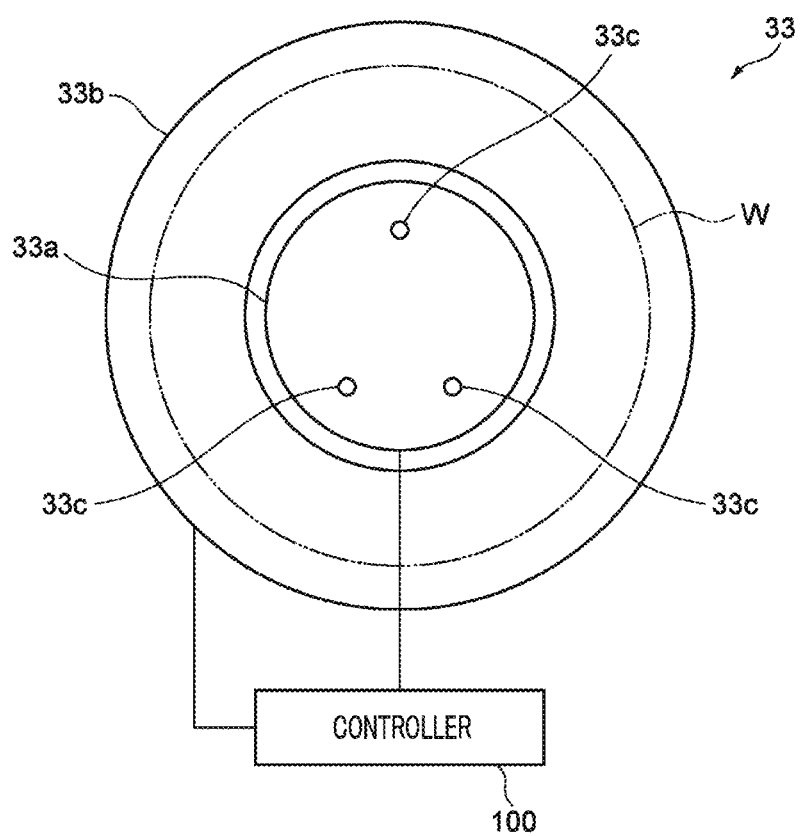
FIG. 4 is a top view schematically illustrating a heat plate.

The rotating/holding unit 30 is equipped with a holding unit 31 and a rotation driving unit 32. The holding unit 31 is configured to hold, from below, the wafer W horizontally with a front surface Wa of the wafer W facing upwards. The holding unit 31 includes a heat plate 33. The heat plate 33 is configured to face a rear surface Wb of the wafer W. The heat plate 33 includes, as shown in FIG. 4, a plurality of heating regions arranged in the diametrical direction of the wafer W. For example, the heat plate 33 includes two heating regions 33*a* and 33*b* concentrically arranged outwards from a center of the wafer W. The heating regions 33*a* and 33*b* incorporate therein heaters individually. As the controller 100 controls the heaters, temperature distributions of the heating regions 33*a* and 33*b* are adjusted individually.

The rotation driving unit 32 rotates both heat plate 33 and the wafer W held by the holding unit 31. The rotation driving unit 32 rotates the holding unit 31 around a vertical axis passing through centers of the wafer W and the heat plate 33 by using, for example, an electric motor as a power source.

Figure 5:
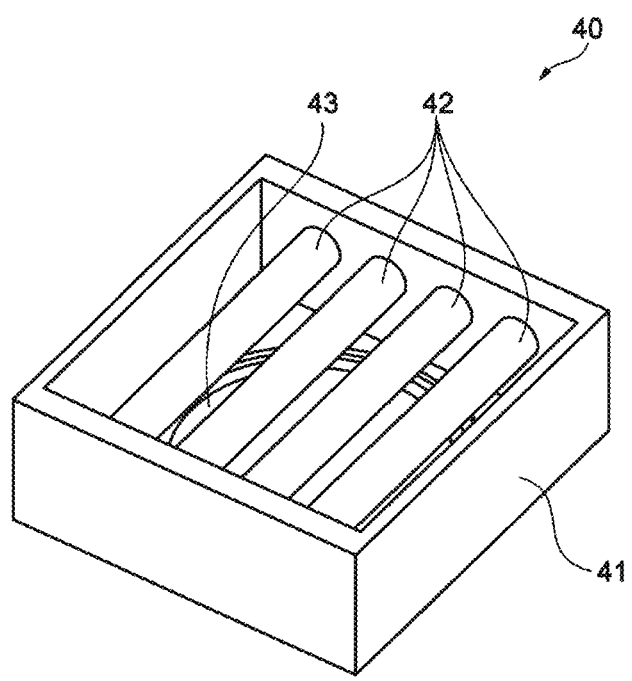
FIG. 5 is a perspective view schematically illustrating an irradiating unit with a ceiling wall of a housing removed.

The light irradiating unit 40 is disposed above the housing 20. The light irradiating unit 40 includes, as shown in FIG. 3 and FIG. 5, a housing 41, a light source 42 and a window 43. The housing 41 accommodates therein at least one light source 42.

Figure 6:
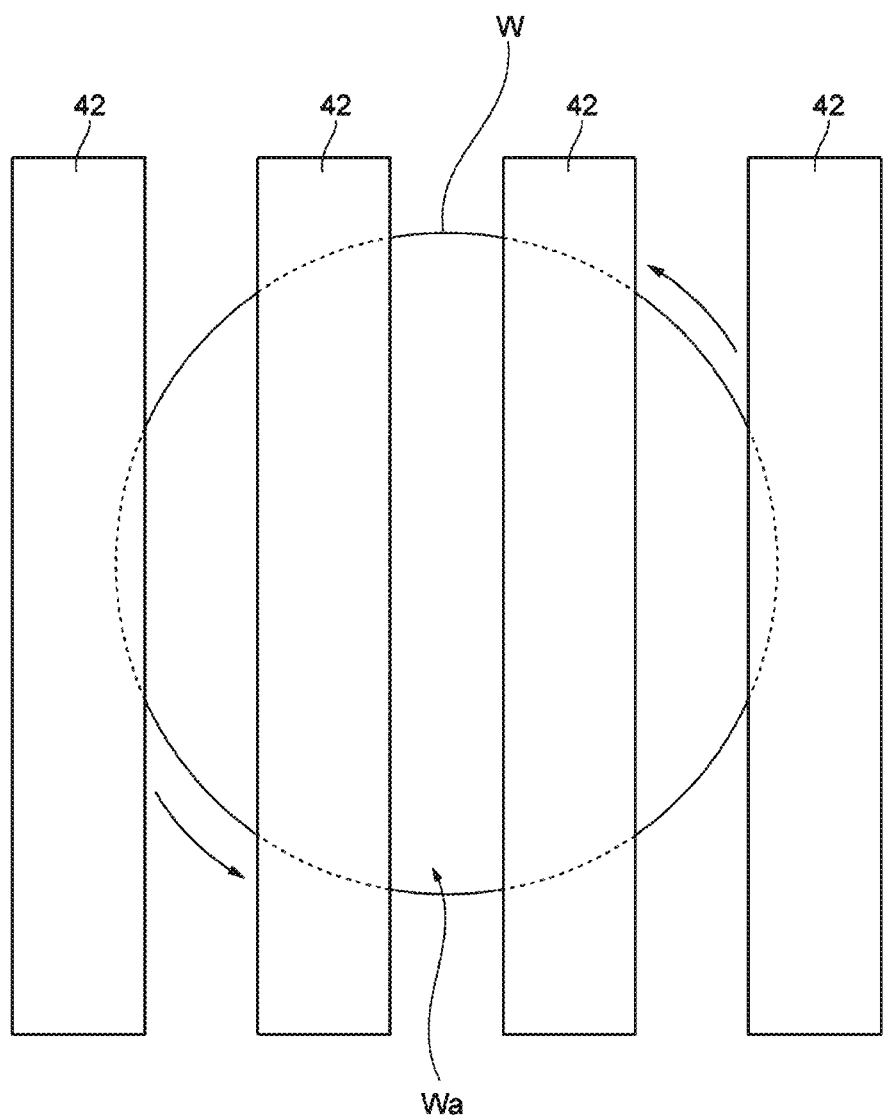
FIG. 6 is a top view schematically illustrating rotation of a wafer with respect to a light source.
Figure 7:
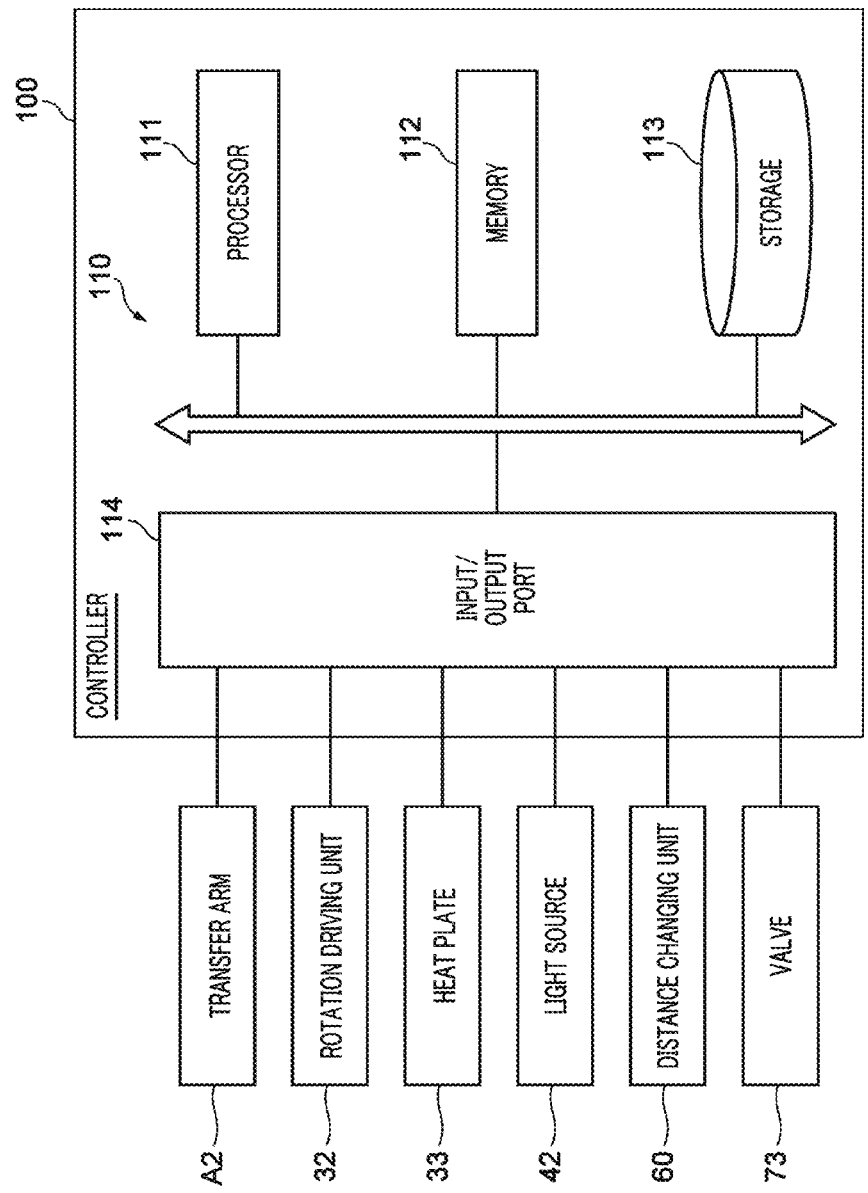
FIG. 7 is a schematic diagram illustrating a hardware configuration of a controller.

The light source 42 is configured to irradiate processing light for aching the organic film to the front surface Wa of the wafer W held by the holding unit 31. The processing light is an ultraviolet ray having a wavelength ranging from, e.g., about 10 nm to 300 nm. The light source 42 has, for example, a straight tube shape and may be extended within the housing 41 to be parallel with the front surface Wa of the wafer W. As depicted in FIG. 5, a plurality of (four in FIG. 5) straight tube-shaped light sources 42 may be arranged within the housing 41 in one direction with a preset distance therebetween. In such a configuration, as depicted in FIG. 6, the processing light from the light sources 42 may not be irradiated to the front surface Wa of the wafer W in a uniform manner. That is, a region of the front surface Wa located directly under the light sources 42 may be easily ached. The reason for moving (rotating in the present exemplary embodiment) the wafer W with respect to the light sources 42 is to uniform deviation in the aching which may occur depending on the arrangement of the light sources 42.

The window 43 is provided at a bottom wall of the housing 41, facing the holding unit 31. The window 43 transmits the processing light from the light source 42 into the housing 20.

The supporting unit 50 is provided under the holding unit 31 within the housing 20. The supporting unit 50 includes a multiple number of supporting pins 51 protruding upwards. Leading ends of the supporting pins 51 are capable of being inserted through through holes (not shown) of the holding unit 31 and through holes 33*c* of the heat plate 33. With this configuration, the leading ends of the supporting pins 51 are protruded above or retracted below the heat plate 33 and support the wafer W when the wafer W is carried into or out of the housing 20.

The distance changing unit 60 is configured to vary a distance between the wafer W held by the holding unit 30 and the light irradiating unit 40. The distance changing unit 60 moves the rotating/holding unit 30 up and down by using, for example, an electric motor or an air cylinder as a power source. If the distance changing unit 60 moves the rotating/holding unit 30 upwards, a gap between the wafer W and the light irradiating unit 40 is reduced, whereas if the distance changing unit 60 moves the rotating/holding unit 30 downwards, the gap between the wafer W and the light irradiating unit 40 is increased. Further, the distance changing unit 60 also serves as a mechanism configured to allow the leading ends of the supporting pins 51 of the supporting unit 50 to be protruded above or retracted below the heat plate 33. To be specific, if the distance changing unit 60 lowers the rotating/holding unit 30, the supporting pins 51 penetrate the holding unit 31 and the heat plate 33, and the leading ends of the supporting pins 51 are protruded above the heat plate 33.

The oxygen supplying unit 70 is configured to supply oxygen-containing gas into the housing 20. The oxygen supplying unit 70 is equipped with a nozzle 71, a gas source 72 configured to supply oxygen into the nozzle 71 and a valve 73 configured to open or close a path from the gas source 72 into the nozzle 71. An opening (supply hole) of the nozzle 71 may be opened toward a center of a space between the wafer W and the light irradiating unit 40. Further, it is desirable that the gas source 72 supplies a gas having an oxygen concentration higher than at least an oxygen concentration of the aforementioned oxygen-containing gas into the nozzle 71 as a gas for adding the oxygen.

The controller 100 includes, as functional components (hereinafter, referred to as "functional modules") for controlling the ashing unit U2, a heat plate control unit 101, an elevation control unit 102, a light source control unit 103, a rotation control unit 104, a valve control unit 105 and a storage unit 106, as depicted in FIG. 3.

The heat plate control unit 101 controls the heat plate 33 to adjust a temperature distribution under the conditions that a difference in the progressions of the ashing between the regions arranged in the diametrical direction of the wafer W is reduced. For example, the heat plate control unit 101 controls the heat plate 33 to decrease a temperature of a heating region corresponding to a region where a progression speed of the ashing (ashing rate) is increased when the temperature distribution is uniform and to increase a temperature of a heating region corresponding to a region where the ashing rate is decreased when the temperature distribution is uniform.

The elevation control unit 102 controls the distance changing unit 60 to move the holding unit 31 and the heat plate 33 up and down. For the purpose, when the wafer W is placed on the heat plate 33, the elevation control unit 102 controls the distance changing unit 60 to vary the gap between the wafer W and the light irradiating unit 40.

The light source control unit 103 controls the light source 42 to irradiate the light for ashing to the front surface Wa of the wafer W.

The rotation control unit 104 controls the rotation driving unit 32 to rotate the wafer W. The rotation control unit 104 may control the rotating/holding unit 30 to decrease a rotational speed of the wafer W with a lapse of time from the beginning of the irradiation of the light for ashing to the wafer W.

The valve control unit 105 controls the valve 73 to supply the oxygen-containing gas into the housing 20.

The storage unit 106 stores previously set control parameters therein. These control parameters include a control target value for the heat plate 33 (for example, a target temperature value of each heating region) which is previously set for the control of the heat plate control unit 101, a control target value for the distance changing unit 60 (for example, a target height value of the holding unit 31) which is previously set for the control of the elevation control unit 102, a control target value for the light source 42 (for example, a target light amount value of each light source 42) which is previously set for the control of the light source control unit 103, a control target value for the rotation driving unit 32 (for example, a target rotational speed value and a target rotation number of the holding unit 31) which is previously set for the control of the rotation control unit 104, and so forth.

The controller 100 is composed of one or more control computers. By way of example, the controller 100 is equipped with a circuit 110 shown in FIG. 7. The circuit 110 includes one or more processors 111, a memory 112, a storage 113 and an input/output port 114. The storage 113 has a computer-readable recording medium such as, but not limited to, a hard disk. The recording medium stores therein programs that cause the aching unit U2 to perform a substrate processing sequence to be described later. The recording medium may be a portable medium such as, by way of example, a non-volatile semiconductor memory, a magnetic disk and an optical disk. The memory 112 temporarily stores thereon the programs loaded from the recording medium of the storage 113 and operation results by the processor 111. The processor 111 constitutes the aforementioned individual functional modules by executing the programs in cooperation with the memory 112. The input/output port 114 performs an input and an output of a signal among the heat plate 33, the transfer arm A2, the rotation driving unit 32, the light source 42, the distance changing unit 60 and the valve 73 in response to an instruction from the processor 111. Further, the hardware configuration of the controller 100 may not be limited to constituting the individual functional modules by the programs. For example, each functional modules of the controller 100 may be implemented by a dedicated logical circuit or an ASIC (Application Specific Integrated Circuit) which is an integration of logical circuits.

[Substrate Processing Method]

Figure 10A:
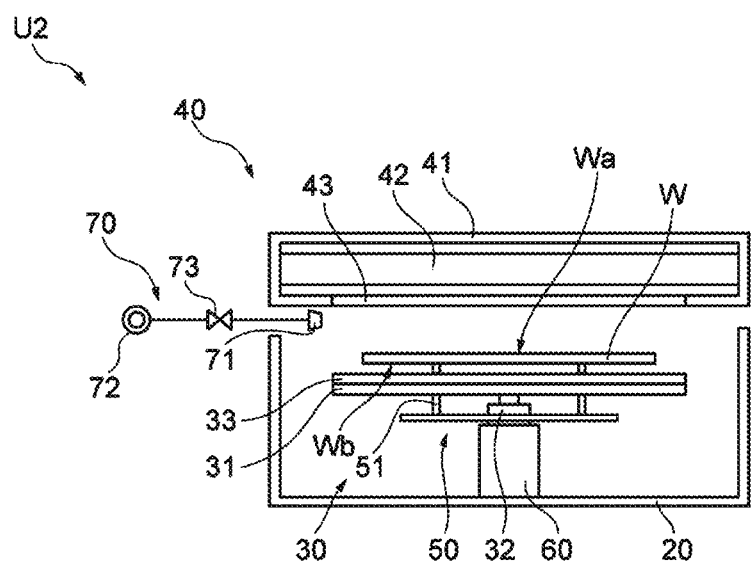
FIG. 10A is a diagram for describing a carry-in/carry-out of a wafer into/from the ashing unit.
Figure 10B:
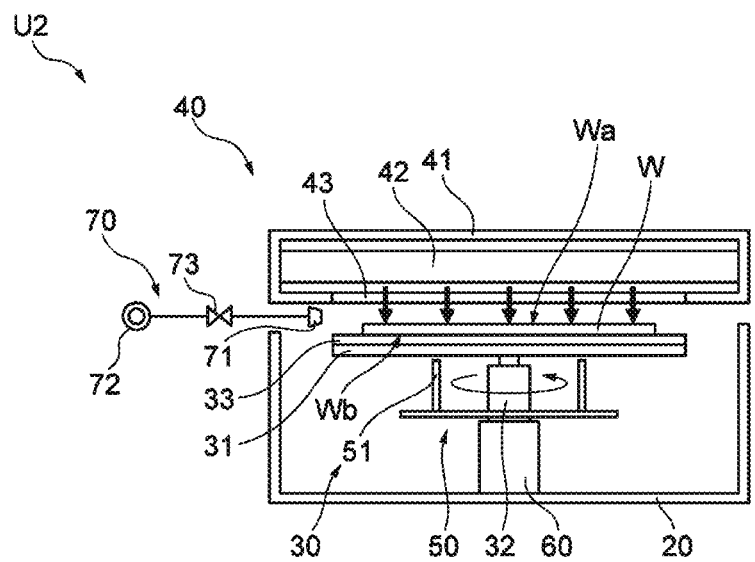
FIG. 10B is a diagram for describing light irradiation to the wafer.

Now, as an example of a substrate processing method, the substrate processing sequence performed by the ashing unit U2 will be explained with reference to FIG. 8, FIG. 10A and FIG. 10B.

Figure 8:
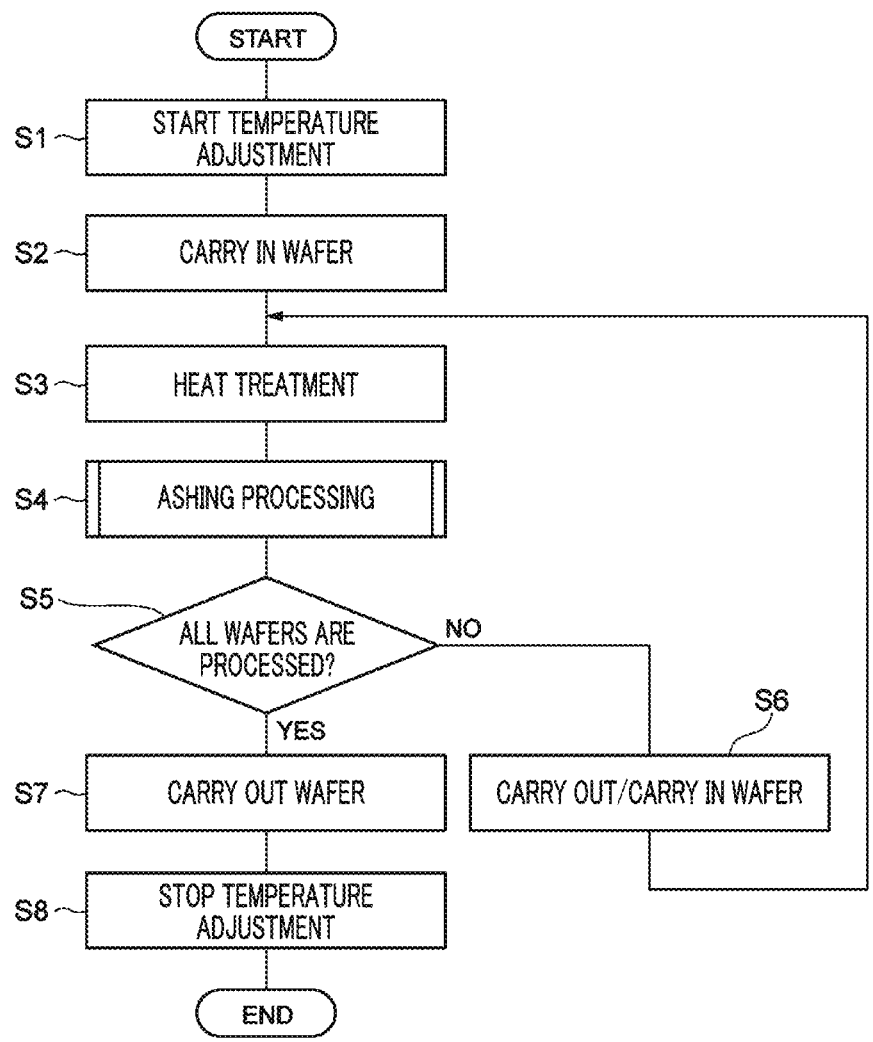
FIG. 8 is a flowchart for describing a wafer processing sequence.

The controller 100 first performs processes 51 and S2 shown in FIG. 8. In the process 51, the heat plate control unit 101 controls the heat plate 33 to start temperature adjustment of each heating region based on the target temperature value for the heat treatment stored in the storage unit 106. In the process S2, the controller 110 performs a control for carrying the wafer W into the housing 20 of the ashing unit U2 by controlling the arms A1 and A2.

If the wafer W is carried into the housing 20, the elevation control unit 102 controls the distance changing unit 60 to lower the holding unit 31 to a position (hereinafter, referred to as "carry-in/carry-out position") where the leading ends of the supporting pins 51 are protruded above the heat plate 33. Thereafter, the controller 100 controls the transfer arm A2 such that the wafer W is placed on the supporting pins 51 with the front surface Wa facing upwards (see FIG. 10A). Then, the elevation control unit 102 controls the distance changing unit 60 to move the holding unit 31 upward until the leading ends of the supporting pins 51 are positioned under the heat plate 33 (see FIG. 10B). Through these operations, the wafer W is placed on the heat plate 33, and heating over the wafer W by the heat plate 33 is begun.

Subsequently, the controller 100 performs processes S3, S4 and S5 shown in FIG. 8. In the process S3, the heat plate control unit 101 waits for a lapse of a predetermined time stored in the storage unit 106. The predetermined time is previously set to allow the organic film to be sufficiently hardened to become the hard mask. The process S4 includes an ashing processing of irradiating processing light for ashing to the organic film on the front surface Wa of the wafer W. A specific sequence of the ashing processing will be described later. Then, the controller 100 performs the process S5. In the process S5, the controller 100 checks whether wafers W as processing targets are all processed.

If it is determined by the controller 100 in the process S5 that the processing on all the wafers W is not completed, the controller 100 performs a process S6. In the process ST6, the controller 100 performs a control for carrying the wafer W out of the housing 20 and carrying a next wafer W into the housing 20. After the process S6, the controller 100 returns the processing back to the process S3. Then, the heat treatment and the ashing processing are repeated until all the wafers W are processed.

In the process S5, if it is determined by the controller 100 that the processing on all the wafers W is completed, the controller 100 performs processes S7 and S8. In the process S7, the controller 100 performs a control for carrying the wafer W out of the housing 20. In the process S8, the heat plate control unit 101 controls the heat plate 33 to stop the operations of the heaters. Through the above-described operations, the control sequence over the ashing unit U2 by the controller 100 is completed.

[Aching Processing]

Now, referring to FIG. 9 to FIG. 11B, an example of a specific sequence of the ashing processing of the process S4 will be elaborated. The controller 100 first performs processes S11 to S14 shown in FIG. 9.

In the process S11, the heat plate control unit 101 controls the heat plate 33 to vary a temperature of each heating region based on a target temperature value for ashing processing stored in the storage unit 106. The target temperature value for ashing processing is previously set to decrease a temperature of a heating region corresponding to a region where an ashing rate is increased when the temperature distribution is uniform and to increase a temperature of a heating region corresponding to a region where the ashing rate is decreased when the temperature distribution is uniform. Typically, it is difficult for the ashing processing to be performed at a central portion of the wafer W, whereas the ashing processing more easily takes place at a peripheral portion of the wafer W. On this ground, the heat plate control unit 101 may control the heat plate 33 such that a temperature of a heating region 33a corresponding to the central portion of the wafer W becomes higher than a temperature of a heating region 33b corresponding to the peripheral portion of the wafer W.

In the process S12, the light source control unit 103 controls the light sources 42 to be turned on.

In the process S13, the rotation control unit 104 controls the rotation driving unit 32 to start the rotation of the holding unit 31 by the rotation driving unit 32. Accordingly, the rotation of the holding unit 31, the heat plate 33 and the wafer W is begun. In the process S13, the rotation control unit 104 controls the rotation driving unit 32 such that the wafer W is rotated by 120° at a regular rotation number. Further, the rotation number of the wafer W may be set to be about 1 rpm to about 100 rpm.

In the process S14, the light source control unit 103 controls the light sources 42 to be turned off.

Then, the controller 100 performs a process S15. In the process S15, the controller 100 determines whether the rotation of the wafer W by 120° has been repeated three times. That is, the controller 100 determines whether the wafer W has been rotated one round (whether the rotation angle of the wafer W has reached 360°).

Figure 11A:
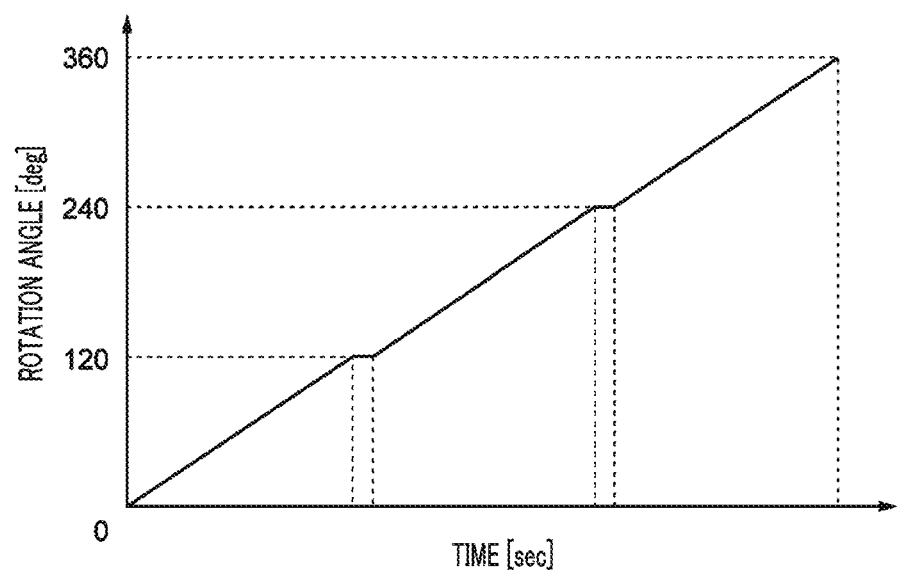
FIG. 11A is a graph showing an example of a variation of a rotation angle of the wafer with a lapse of time.

In the process S15, if it is determined by the controller 100 that the wafer W is not rotated one round, the controller 100 performs the processes S12 to S14 again. Thus, as shown in FIG. 11A, the wafer W is temporarily stopped after being rotated at a regular rotation number until the rotation angle reaches 120°, then temporarily stopped after being rotated at the regular rotation number until the rotation angle reaches 240°, and then finally stopped after being rotated at the regular rotation number until the rotation angle reaches 360°. That is, the wafer W intermittently repeats the rotation and the stop of the rotation thereof.

Figure 11B:
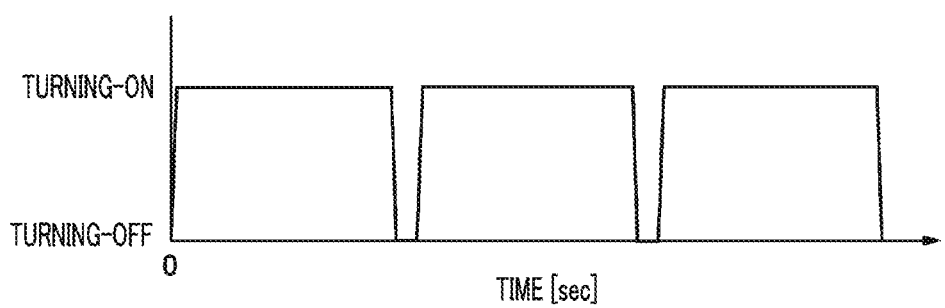
FIG. 11B is a graph showing an example of a variation of turning-on and turning-off of the light source with the lapse of time.

Meanwhile, the light source 42 repeats turning-on and turning-off thereof according to the aforementioned intermittent operation of the wafer W, as depicted in FIG. 11B. To elaborate, when the rotating operation of the wafer W is begun from a state where the rotation angle of the wafer W is 0° (first posture), the turning-on operation of the light source 42 is also begun. Then, when the stopping operation of the wafer W is begun as the wafer W comes into a state where the rotation angle thereof has reached 120° (second posture), the turning-off operation of the light source 42 is begun. Likewise, when the rotating operation of the wafer W is begun from a state where the rotation angle of the wafer W is 120° (third posture), the turning-on operation of the light source 42 is begun. Then, when the stopping operation of the wafer W is begun as the wafer W comes into a state where the rotation angle thereof has reached 240° (fourth posture), the turning-off operation of the light source 42 is begun. Further, still likewise, when the rotating operation of the wafer W is begun from a state where the rotation angle of the wafer W is 240°, the turning-on operation of the light source 42 is begun. Then, when the stopping operation of the wafer is begun as the wafer W comes into a state where the rotation angle thereof reaches 360°, the turning-off operation of the light source 42 is begun. Accordingly, when the turning-on operation of the light source 42 is begun, the rotation angles of the wafer W (the postures of the wafer W) are all different.

In the process S15, if it is determined by the controller 100 that the wafer W has been rotated one round, the controller 100 performs a process S16. In the process S16, the heat plate control unit 101 controls the heat plate 33 to return the temperature of each heating region to the target temperature value for the heat treatment stored in the storage unit 106. Through these operations, the ashing processing is completed.

[Effects]

Through researches by the present inventors, however, it is found out that the operation of the light source 42 is not stable at the beginning. That is, immediately after the processing light from the light source 42 is turned on, there may exist some non-uniformity until the processing light comes into a normal state. For this reason, if the wafer W is always at the same rotation angle (posture) when the turning-on of the light irradiating unit is begun, an adverse influence caused by the non-stable beginning of the operation of the light source 42 may be concentrated to a preset place of the wafer W. Specifically, the ashing may not progress sufficiently at this preset place of the wafer W, and there may be caused non-uniformity in the film removal amount of the protective film.

According to the present exemplary embodiment, however, the rotation angles of the wafer W (the postures of the wafer W) are all different whenever the turning-on operation of the light source 42 is begun. Therefore, the adverse influence caused by the non-stable beginning of the operation of the light source 42 is suppressed from being concentrated to the preset place of the wafer W. Therefore, when ashing the protective film formed on the front surface Wa of the wafer W, uniformity in the film removal amount by the ashing within the surface of the wafer W can be improved.

In the present exemplary embodiment, the rotation number of the wafer W may be set to be in a range from 1 rpm to 100 rpm. In this case, the wafer W is rotated at a relatively high rotation number at least in an initial stage of the ashing processing (initial processing). In the initial processing, a removing rate tends to be large, as compared to that in the subsequent processing. Therefore, in the initial processing where the removing rate is relatively large, a larger area of the wafer W is ached. Hence, it is possible to further improve the uniformity in the film removal amount by the ashing within the surface of the wafer W.

(Other Modification Examples)

So far, the exemplary embodiment has been described. However, it should be noted that various changes and modifications may be made within the scope of the present disclosure.

Figure 9:
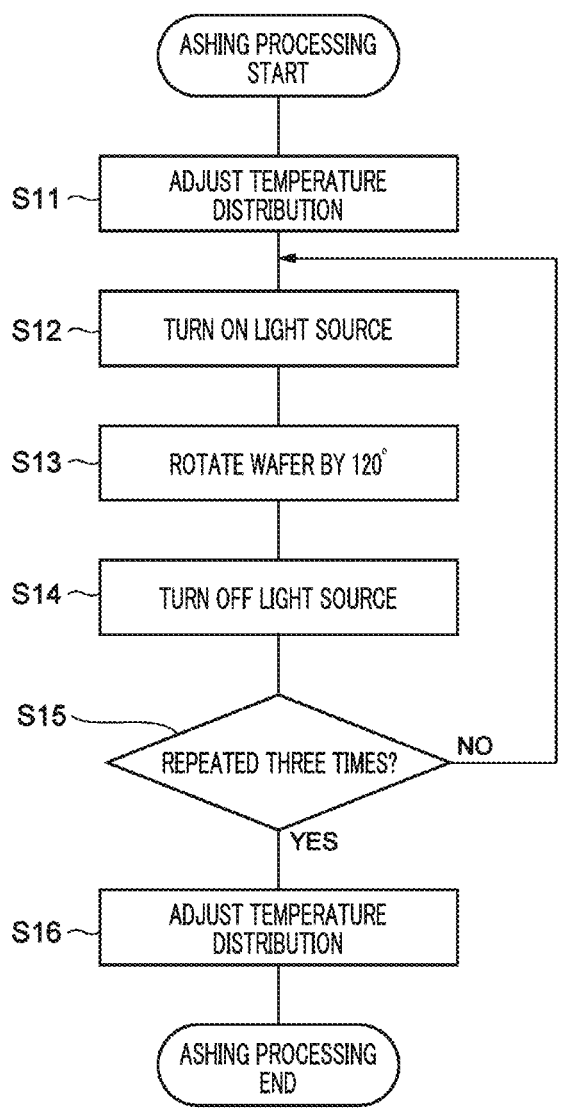
FIG. 9 is a flowchart for describing an example of an ashing processing sequence.
Figure 13:
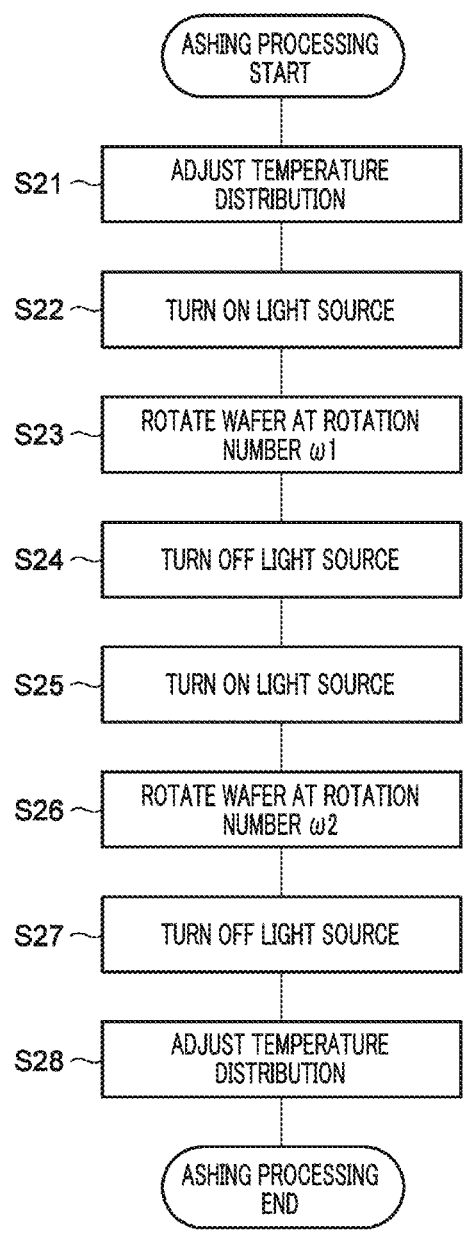
FIG. 13 is a flowchart for describing another example of the ashing processing sequence.

(1) For example, instead of the ashing processing shown in FIG. 9, an ashing processing shown in FIG. 13 may be performed. In this case, the controller 100 first performs processes S21 to S24. Since the processes S21, S22 and S24 are the same as the processes S11, S12 and S14 of FIG. 9, respectively, redundant description thereof will be omitted.

In the process S23, the rotation control unit 104 controls the rotation driving unit 32 to start the rotation of the holding unit 31 by the rotation driving unit 32. Accordingly, the rotation of the holding unit 31, the heat plate 33 and the wafer W is begun. In the process S23, the rotation control unit 104 controls the rotation driving unit 32 such that the wafer W is rotated one round at a rotation number $\omega 1$ (first speed). Here, the rotation number $\omega 1$ may be set to be about 1 rpm to about 100 rpm.

Then, the controller 100 performs processes S25 to S27. Since the processes S25 and S27 are the same as the processes S22 and S24, respectively, redundant description thereof will be omitted here.

In the process S26, the rotation control unit 104 controls the rotation driving unit 32 to start the rotation of the holding unit 31 by the rotation driving unit 32. Accordingly, the rotation of the holding unit 31, the heat plate 33 and the wafer W is begun. In the process S26, the rotation control unit 104 controls the rotation driving unit 32 such that the wafer W is rotated one round at a rotation number $\omega 2$ (second speed). Here, the rotation number $\omega 2$ is set to be lower than the rotation number $\omega 1$ ($\omega 1 > \omega 2$).

Figure 14A:
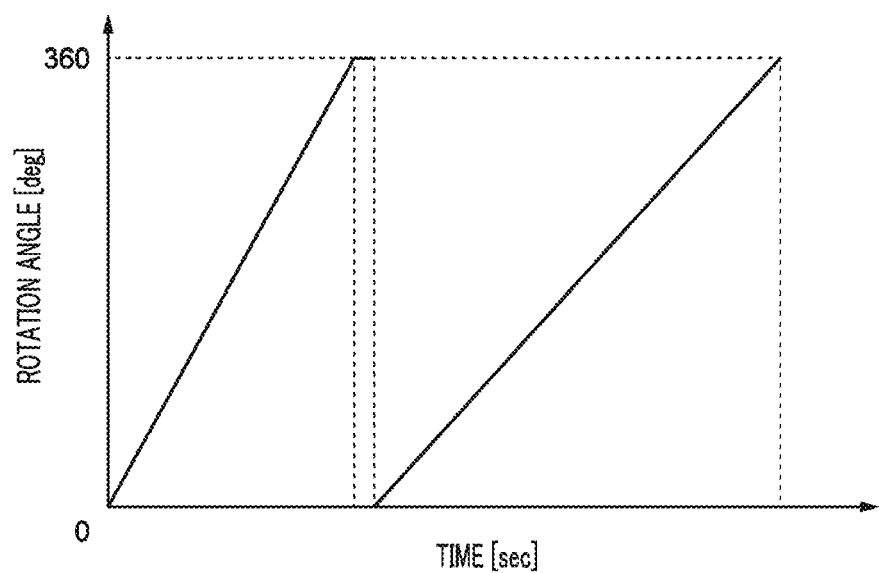
FIG. 14A is a graph showing another example of a variation of a rotation angle of the wafer with a lapse of time.
Figure 14B:
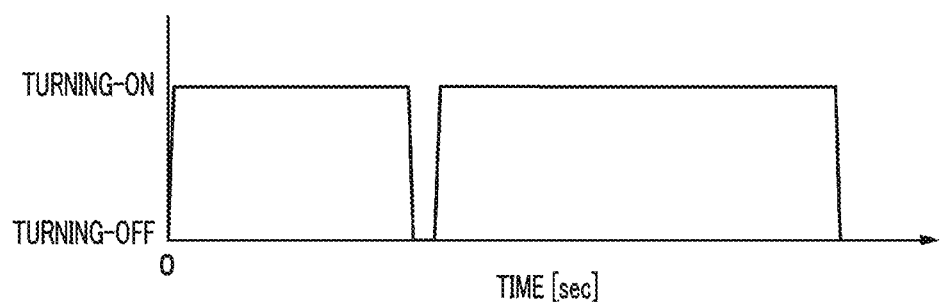
FIG. 14B is a graph showing another example of a variation of turning-on and turning-off of the light source with the lapse of time.

Referring to FIG. 14A, during the processes S22 to S27, the wafer W is temporarily stopped after being rotated one round at the rotation number $\omega 1$, and then stopped after being rotated one round at the rotation number $\omega 2$. That is, the wafer W repeats the rotation and the stop of the rotation intermittently. Meanwhile, the light source 42 repeats the turning-on and the turning-off according to the intermittent operation of the wafer W, as shown in FIG. 14B.

Thereafter, the controller 100 performs a process S28. Here, since the process S28 is the same as the process S16 of FIG. 9, redundant description thereof will be omitted.

So far, it is assumed that the film removal amount by the ashing remains substantially same regardless of a lapse of time. According to researches by the present inventors, however, it is found out that the film removal amount by the ashing is largest at the beginning of the ashing processing and gradually decreases with a lapse of the processing time, as shown in FIG. 12.

Figure 12:
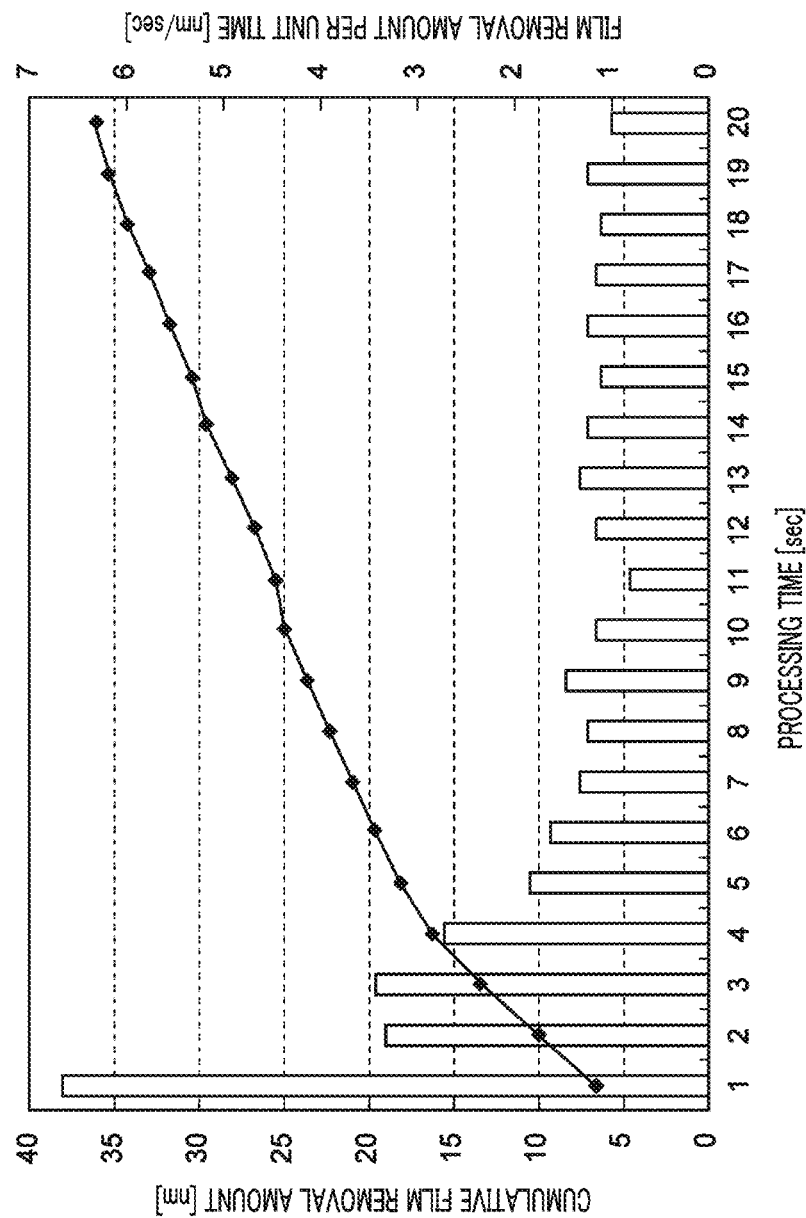
FIG. 12 is a graph showing a relationship between a wafer ashing processing time and a film removal amount per unit time and a relationship between the wafer ashing processing time and a cumulative film removal amount.

A cumulative film removal amount and a film removal amount per unit time shown in FIG. 12 are obtained as follows. First, 20 sheets of wafers W are prepared, and the protective film having a substantially same thickness is formed on the front surface Wa of each of the wafer W. Then, the ashing processing is performed on these 20 sheets of wafers W while changing the irradiation time (processing time) of the processing light to the wafer W from the light source 42 by 1 sec. For example, the ashing processing is performed on a first sheet of wafer W for 1 sec. The ashing processing is performed on a second sheet of wafer W for 2 sec. The ashing processing is performed on a third sheet of wafer W for 3 sec. To generalize, the ashing processing is performed on the $M^{th}$ wafer for M sec (M is a natural number ranging from 1 to 20).

The film removal amount is measured for each of the 20 sheets of wafers W subjected to the ashing processing. By plotting these film removal amounts, a polygonal line graph in FIG. 12 showing "cumulative film removal amount" is obtained. Further, for all of the wafers W, by subtracting the film removal amount of the $(M-1)^{th}$ sheet of wafer W from the film removal amount of the $M^{th}$ sheet of wafer, a processing of calculating a difference between the film removal amount of the $M^{th}$ sheet of wafer W and the film removal amount of the $(M-1)^{th}$ sheet of wafer W is performed. Here, although $0^{th}$ sheet of wafer does not actually exist, the film removal amount thereof is assumed as zero (0). By plotting these differences, a bar graph of FIG. 12 showing "film removal amount per unit time" is obtained.

According to the present modification example, the rotation number $\omega 1$ of the wafer W at the initial stage of the ashing processing (initial processing) is set to be higher than the rotation number $\omega 2$ of the wafer W in the later stage of the ashing processing (subsequent processing). Therefore, a larger area of the substrate is ached at the initial processing where the removing rate is large. Accordingly, concentration of the influence caused by the initial processing to the preset position of the wafer W is suppressed. As a result, when ashing the protective film formed on the front surface Wa of the wafer W, it is possible to improve the uniformity in the film removal amount by the ashing within the surface of the wafer.

Figure 15A:
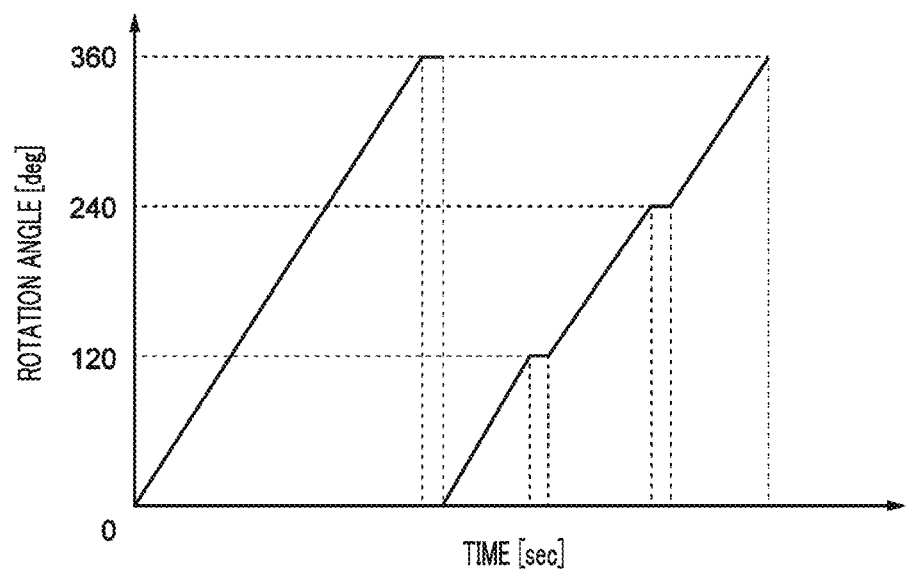
FIG. 15A is a graph showing yet another example of a variation of a rotation angle of the wafer with a lapse of time.
Figure 15B:
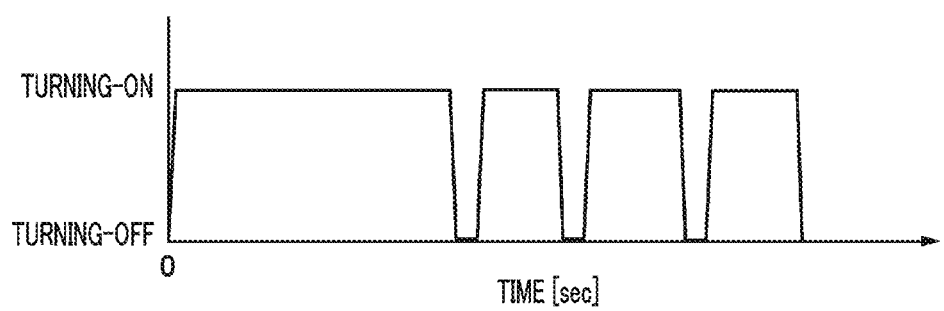
FIG. 15B is a graph showing yet another example of a variation of turning-on and turning-off of the light source with the lapse of time.

(2) The rotation of the wafer W and the turning-on/off of the light source 42 may be controlled as shown in FIG. 15A and FIG. 15B. To elaborate, as depicted in FIG. 15A, the wafer W is temporarily stopped after being rotated one round at a regular rotation number. Then, the wafer W is temporarily stopped after being rotated at the regular rotation number until the rotation angle reaches 120°, then temporarily stopped after being rotated at the regular rotation number until the rotation angle reaches 240°, and then finally stopped after being rotated at the regular rotation number until the rotation angle reaches 360°. Meanwhile, the light source 42 repeats the turning-on and the turning-off according to the intermittent operation of the wafer W, as shown in FIG. 15B.

Figure 16A:
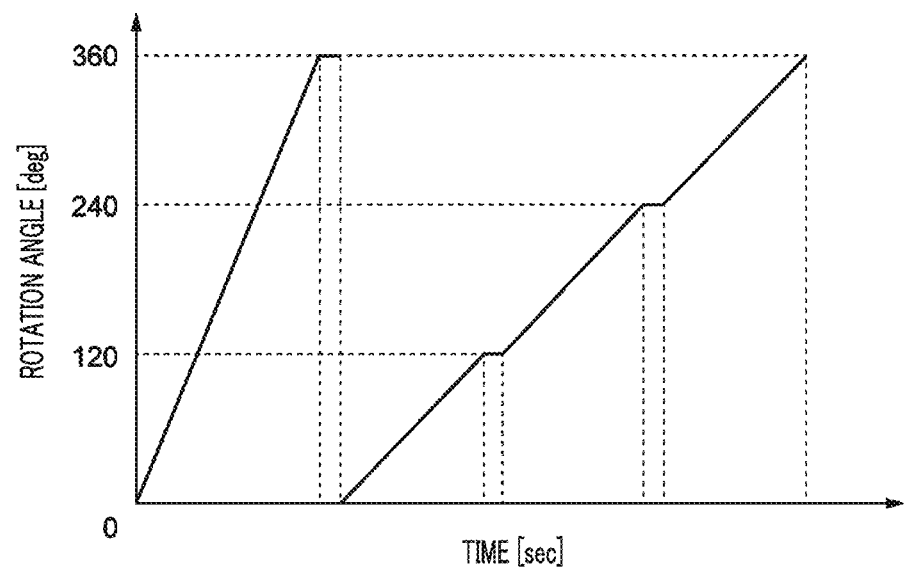
FIG. 16A is a graph showing still yet another example of a variation of a rotation angle of the wafer with a lapse of time.
Figure 16B:
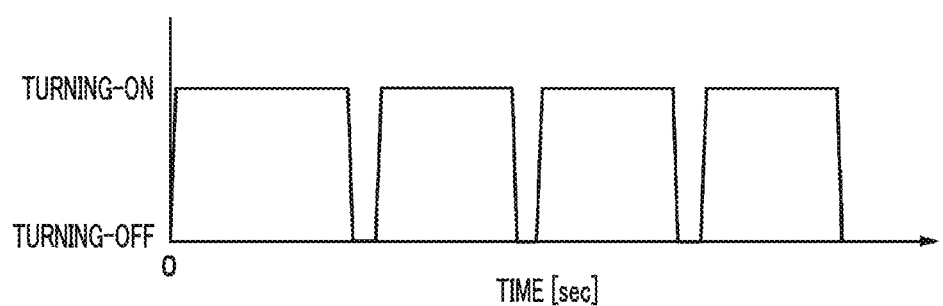
FIG. 16B is a graph showing still yet another example of a variation of turning-on and turning-off of the light source with the lapse of time.

(3) The rotation of the wafer W and the turning-on/off of the light source 42 may be controlled as shown in FIG. 16A and FIG. 16B. To elaborate, as depicted in FIG. 16A, the wafer W is temporarily stopped after being rotated one round at a rotation number $\omega 1$. Then, the wafer W is temporarily stopped after being rotated at a rotation number $\omega 2$ until the rotation angle reaches 120°, then temporarily stopped after being rotated at the rotation number $\omega 2$ until the rotation angle reaches 240°, and then finally stopped after being rotated at the rotation number $\omega 2$ until the rotation angle reaches 360° ($\omega 1 > \omega 2$). Meanwhile, the light source 42 repeats the turning-on and the turning-off according to the intermittent operation of the wafer W, as shown in FIG. 16B.

Figure 17A:
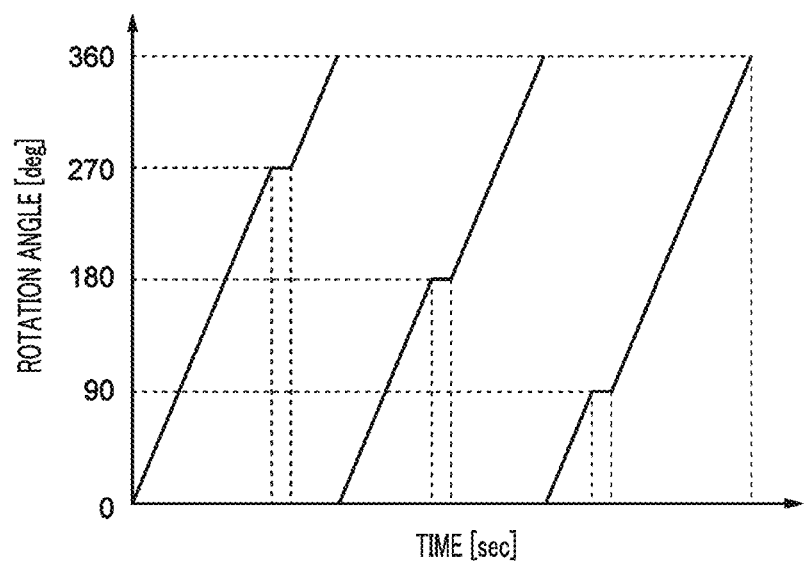
FIG. 17A is a graph showing still yet another example of a variation of a rotation angle of the wafer with a lapse of time.
Figure 17B:
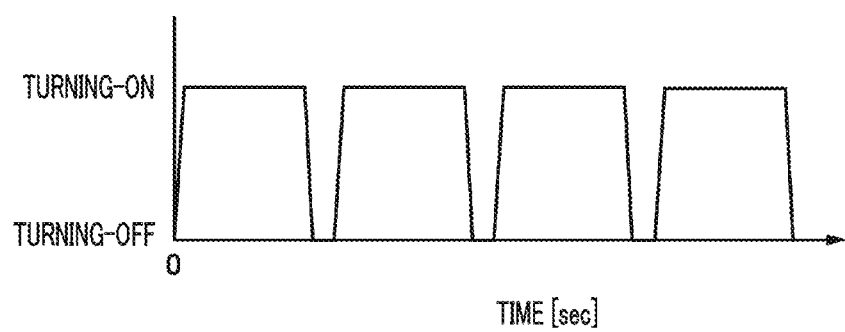
FIG. 17B is a graph showing still yet another example of a variation of turning-on and turning-off of the light source with the lapse of time.

(4) The rotation of the wafer W and the turning-on/off of the light source 42 may be controlled as shown in FIG. 17A and FIG. 17B. To elaborate, as depicted in FIG. 17A, the wafer W is temporarily stopped after being rotated at a regular rotation number until the rotation angle reaches 270°; temporarily stopped after being rotated at the regular rotation number until the rotation angle reaches 180° (540°); temporarily stopped after being rotated at the regular rotation number until the rotation angle reaches 90° (810°), and then finally stopped after being rotated at the regular rotation number until the rotation angle reaches 360° (1080°). Meanwhile, the light source 42 repeats the turning-on and the turning-off according to the intermittent operation of the wafer W, as shown in FIG. 17B.

Figure 18A:
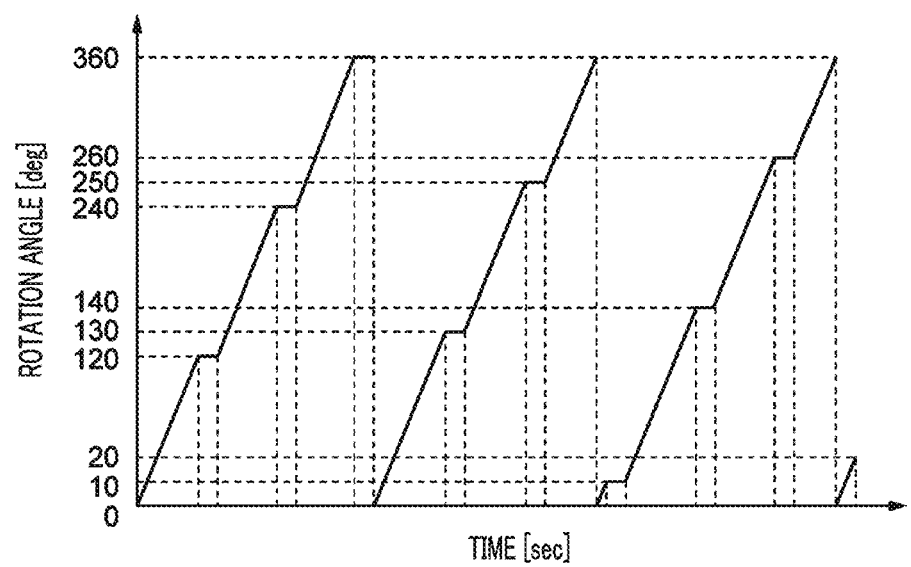
FIG. 18A is a graph showing still yet another example of a variation of a rotation angle of the wafer with a lapse of time.
Figure 18B:
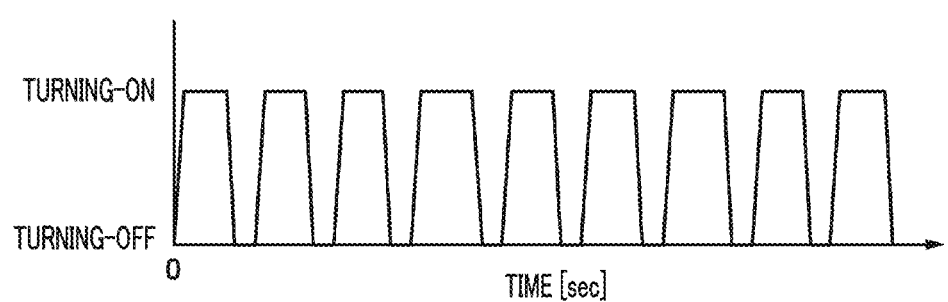
FIG. 18B is a graph showing still yet another example of a variation of turning-on and turning-off of the light source with the lapse of time.

Alternatively, the rotation of the wafer W and the turning-on/off of the light source 42 may be controlled as shown in FIG. 18A and FIG. 18B. To elaborate, as depicted in FIG. 18A, an operation of stopping the wafer W after rotating the wafer W by 120° at a regular rotation number is repeated until the wafer W is rotated one round. Then, an operation of temporarily stopping the wafer W after rotating the wafer W by 130° at the regular rotation number, temporarily stopping the wafer W after rotating the wafer W by 120° at the regular rotation number and temporarily stopping the wafer W after rotating the wafer W by 120° at the regular rotation number is repeated twice. Meanwhile, the light source 42 repeats the turning-on and the turning-off according to the intermittent operation of the wafer W, as shown in FIG. 18B. Further, though an angular variation amount of the wafer W at the beginning of the turning-on of the light source 42 is by 10° in the example shown in FIG. 18A and FIG. 18B, this angular variation amount can be set as required.

In this case, when the turning-on operation of the light source 42 is begun, the rotation angles of the wafer W (the postures of the wafer W) are all different. Therefore, the adverse influence caused by the non-stable beginning of the operation of the light source 42 is suppressed from being concentrated to the preset place of the wafer W. Therefore, when ashing the protective film formed on the front surface Wa of the wafer W, it is possible to improve the uniformity in the film removal amount by the ashing within the surface of the wafer W.

(5) The wafer W may be moved relatively to the light source 42. That is, the ashing unit U2 may be configured such that at least one of the wafer W or the light source 42 is moved. For example, as illustrated in FIG. 19, the wafer W may be slid in one direction with respect to the light source 42.

(6) Through researches by the present inventors, the present inventors found out the following. While the light source 42 is turned on, the light source 42 generates heat. Accordingly, if a preset time period elapses after the light source 42 is turned off, a temperature of the light source 42 is decreased, so that the temperature of the light source 42 may be different before and after the processing. It is found out that such a temperature variation of the light source 42 results in a variation of the removing rate as well. This is deemed to be because light transmittance of the window 43 is changed as a temperature of the window 43 is varied by the temperature variation of the light source 42.

Figure 20A:
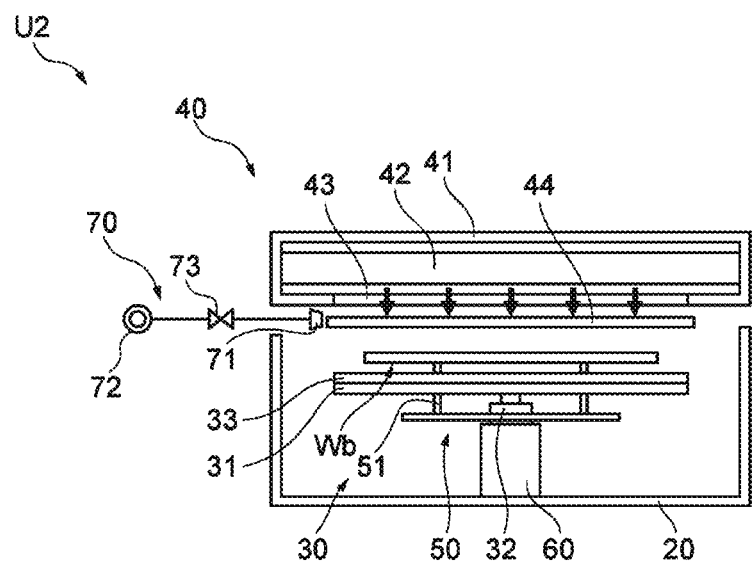
FIG. 20A is a diagram for describing dummy irradiation and FIG. 20B is a diagram for describing light irradiation to the wafer.
Figure 20B:
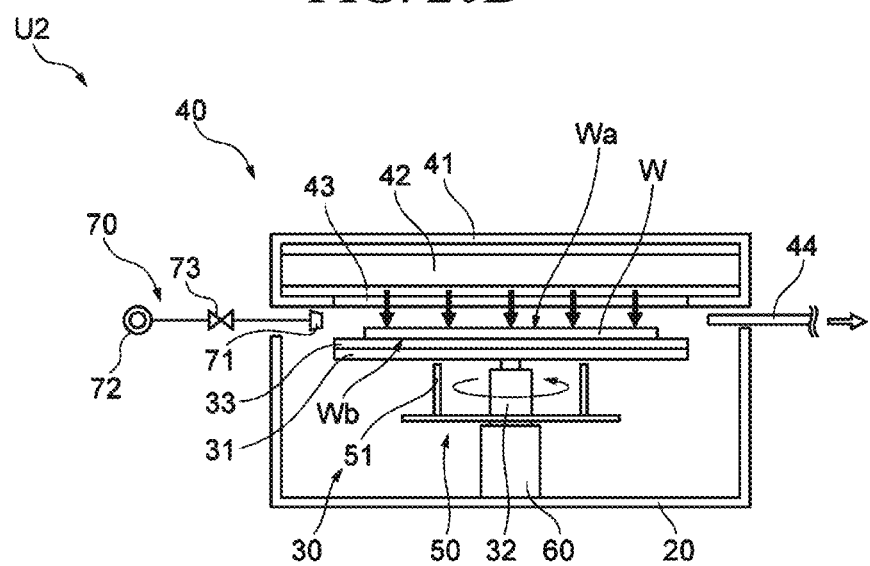

In view of this, if a time period during which the light source 42 is turned off is equal to or longer than a predetermined time length, the processing light from the light source 42 may not be irradiated to the wafer W when the light source 42 is turned on, but the processing light from the light source 42 may be irradiated to the wafer W after the temperature of the light source 42 is stabilized (dummy irradiation processing). For example, the light source 42 may be turned on such that the processing light is not irradiated to the wafer W, and, later on, the processing light may be irradiated to the wafer W. To be more specific, as depicted in FIG. 20A, a light shielding member 44 may be disposed between the window 43 and the rotating/holding unit 30 (wafer W), and the light source 42 is turned on in this state. As a result, the processing light from the light source 42 is shielded by the light shielding member 44 and hardly reaches the wafer W. Thereafter, as shown in FIG. 20B, with the light source 42 turned on, the light shielding member 44 is moved not to be located in the space between the window 43 and the rotating/holding unit 30 (wafer W).

With this configuration, the processing light from the light source 42 is irradiated to the wafer W after the temperatures of the light source 42 and the window 43 are stabilized. Therefore, the variation in the removing rate which may be caused by the temperature variation of the light source 42 can be suppressed. Hence, it is possible to further improve the uniformity in the film removal amount by the aching within the surface of the wafer W.

Another method may be adopted to irradiate the processing light from the light source 42 to the wafer W after the temperature of the light source 42 is stabilized. By way of example, the light source 42 may be turned on when the wafer W does not exist within the housing 20, and the wafer W may be carried into the housing 20 after the temperature of the light source 42 is stabilized. In case that a standby time (interval time) before a next wafer W is carried into the ashing unit U2 after the wafer W after being subjected to the ashing processing is carried out of the ashing unit U2 is predetermined (for example, this standby time is previously set in the controller 100), the light source 42 may be turned on before this standby time elapses. If the temperature of the light source 42 is stabilized by turning the light source 42 on before the standby time passes by, the light source 42 may be turned off before irradiating the processing light from the light source 42 to the wafer W and then turned on again when irradiating the processing light to the wafer W. In this case, it is possible to achieve both the improvement of the uniformity in the film removal amount by the ashing within the surface of the wafer W and the reduction of the power consumption of the light source 42. The temperature of the light source 42 or the window 43 is measured, and when this temperature is equal to or less than a preset value, the above-described dummy irradiation processing may be performed.

(7) In case that the oxygen-containing gas continuously flows around the wafer W in the ashing processing, the smaller the gap is, the more difficult it is for a flow of the oxygen-containing gas to be formed in the gap, so that the removing rate tends to be decreased. Meanwhile, the larger the gap is, the easier it is for the flow to be formed in the gap, so that the removing rate tends to be increased. Further, in the ashing processing, if the flow of the oxygen-containing gas is not formed around the wafer W, the larger the gap is, the more difficult it is for the processing light from the light source 42 to reach the wafer W, so that the removing rate tends to be decreased. Meanwhile, the smaller the gap is, the easier it is for the processing light from the light source 42 to reach the substrate, so that the removing rate tends to be increased.

Thus, the elevation control unit 102 may control the distance changing unit 60 such that the gap is of a first size at the initial ashing processing and becomes to have a second size different from the first size in the subsequent ashing processing. That is, if the oxygen-containing gas continuously flows around the substrate in the ashing processing, the first size may be set to be smaller than the second size. In this case, it is difficult for the oxygen-containing gas to be supplied to the wafer W at the initial ashing processing. Meanwhile, if the flow of the oxygen-containing gas is not formed around the substrate in the ashing processing, the first size may be set to be larger than the second size. In this case, it is difficult for the processing light from the light source 42 to reach the wafer W at the initial ashing processing. Thus, in any of these two cases, the removing rate may become uniform at the initial ashing processing where the removing rate tends to be larger and in the subsequent ashing processing. Consequently, the uniformity in the film removal amount by the ashing within the surface of the wafer W can be further improved.

(8) In the above-described exemplary embodiment, the wafer W is rotated by 120°. However, the rotation angle of the wafer W per a single time may be set to be 360°/N (N denotes a natural number ranging from 2 to 180 and a divisor of 360).

(9) In the above-described exemplary embodiment, the wafer W is rotated in the same direction. However, the wafer W may be rotated in the backward direction after being rotated in the forward direction.

EXPERIMENTAL EXAMPLES

Experimental examples 1 to 3 and a comparative example are conducted to investigate whether the uniformity in the film removal amount by the ashing within the surface of the wafer is improved when ashing the protective film in the ashing unit U2 according to the exemplary embodiment.

Experimental Example 1

Figure 21A:
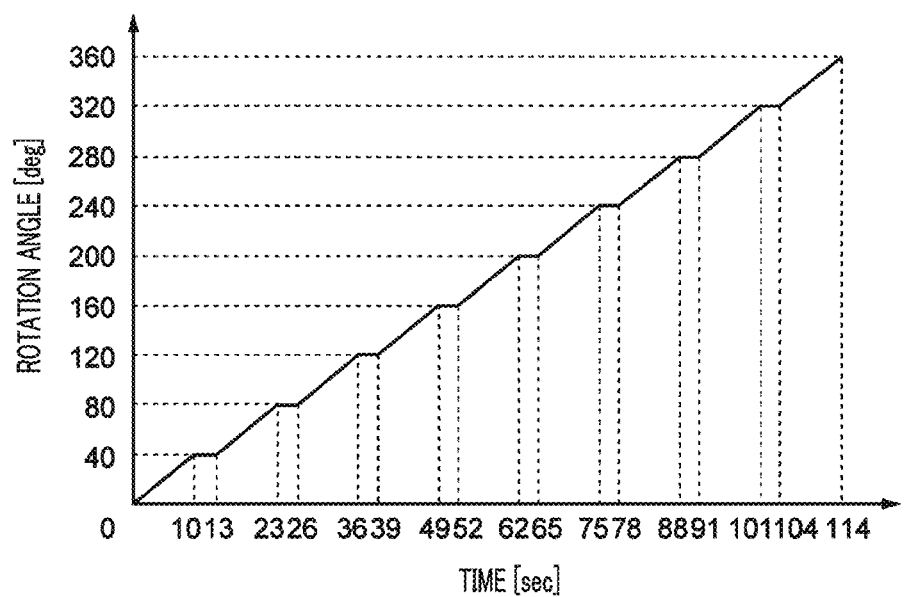
FIG. 21A is a graph showing a variation of a rotation angle of a wafer with a lapse of time in a first experimental example.
Figure 21B:
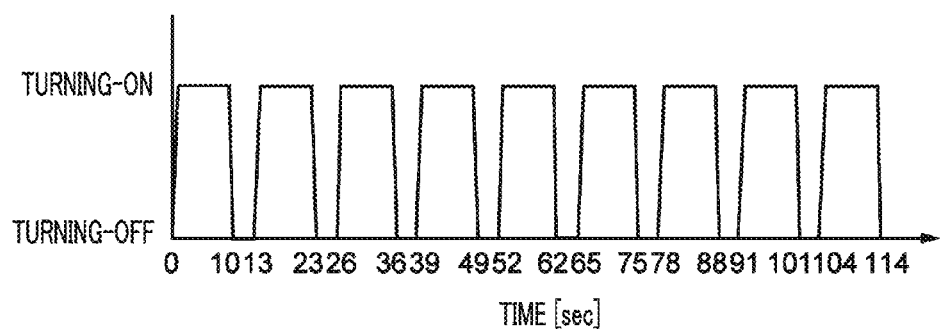
FIG. 21B is a graph showing a variation of turning-on and turning-off of the light source in the first experimental example.

A disk-shaped wafer W having the protective film formed on the front surface Wa thereof is prepared, and the wafer W is subjected to the ashing processing in the ashing unit U2. In the ashing processing, the rotation of the wafer W and the turning-on/off of the light source 42 are controlled as shown in FIG. 21A and FIG. 21B. To elaborate, as depicted in FIG. 21A, a processing of rotating the wafer W by 40° for 10 sec and temporarily stopping the rotation of the wafer W for 3 sec is repeated until the wafer W is rotated one round. Meanwhile, as depicted in FIG. 21B, the turning-on and the turning-off of the light source 42 are repeated according to this intermittent operation of the wafer W. Accordingly, the processing light from the light source 42 is irradiated to the wafer W for a total time length of 90 sec. Further, in the ashing processing, the heat plate 33 is controlled such that temperatures of all the heating regions 33a and 33b are substantially same.

Experimental Example 2

Figure 22A:
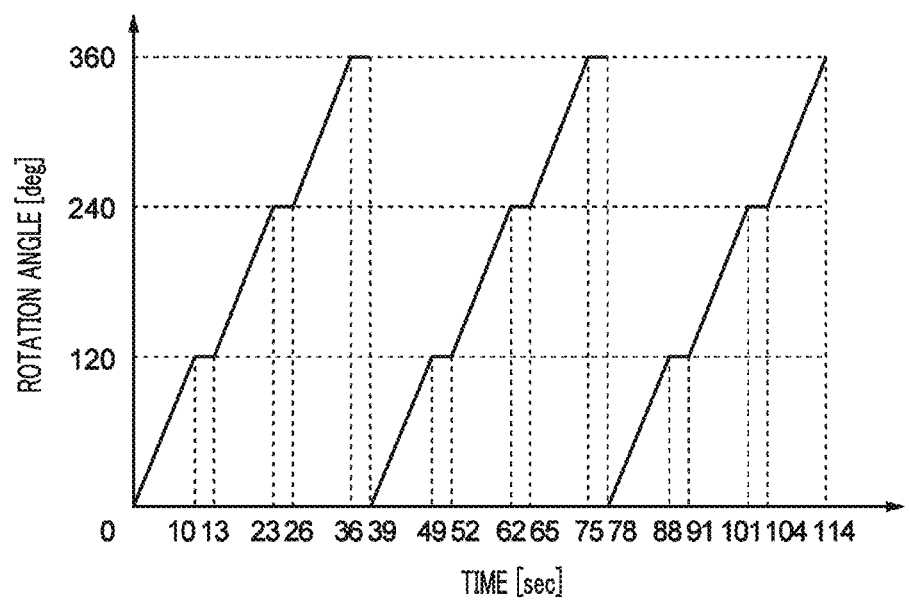
FIG. 22A is a graph showing a variation of a rotation angle of a wafer with a lapse of time in a second experimental example.
Figure 22B:
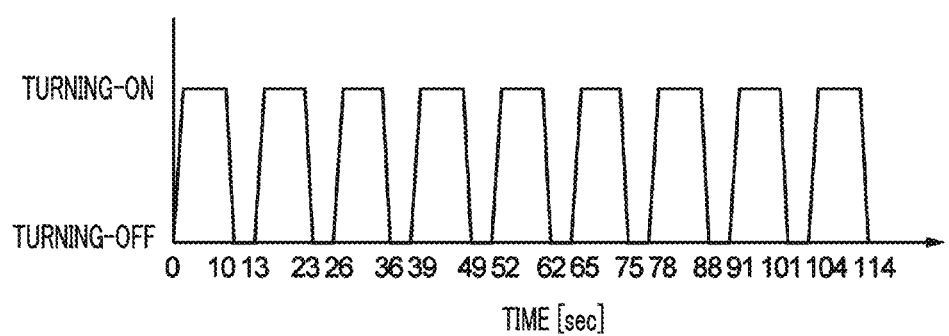
FIG. 22B is a graph showing a variation of turning-on and turning-off of the light source in the second experimental example.

A disk-shaped wafer W having the protective film formed on the front surface Wa thereof is prepared, and the wafer W is subjected to the ashing processing in the ashing unit U2. In the ashing processing, the rotation of the wafer W and the turning-on/off of the light source 42 are controlled as shown in FIG. 22A and FIG. 22B. To elaborate, as depicted in FIG. 22A, a processing of rotating the wafer W by 120° for 10 sec and temporarily stopping the rotation of the wafer W for 3 sec is repeated until the wafer W is rotated three rounds. Meanwhile, as depicted in FIG. 22B, the turning-on and the turning-off of the light source 42 are repeated according to this intermittent operation of the wafer W. Accordingly, the processing light from the light source 42 is irradiated to the wafer W for a total time length of 90 sec. Further, in the ashing processing, the heat plate 33 is controlled such that temperatures of all the heating regions 33a and 33b are substantially same Experimental Example 3

Figure 23A:
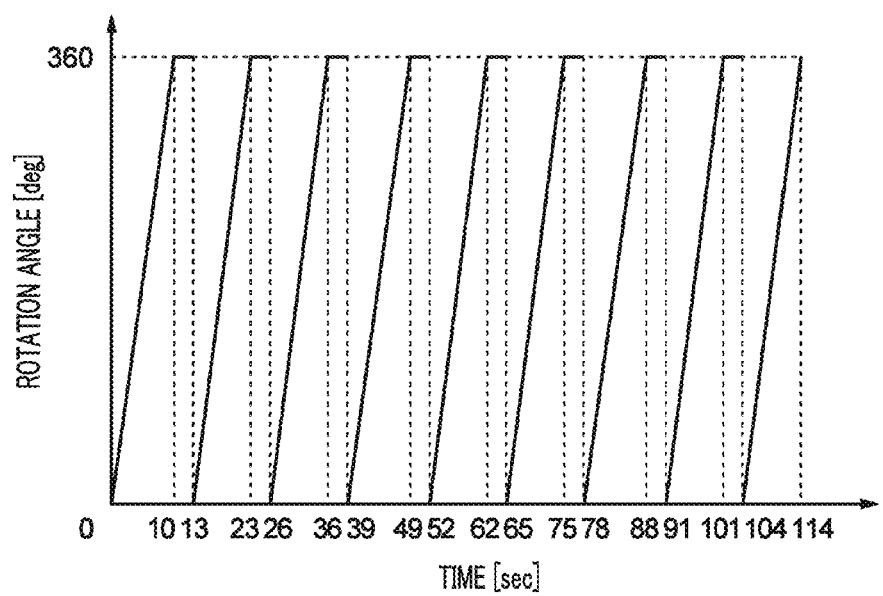
FIG. 23A is a graph showing a variation of a rotation angle of a wafer with a lapse of time in a third experimental example.
Figure 23B:
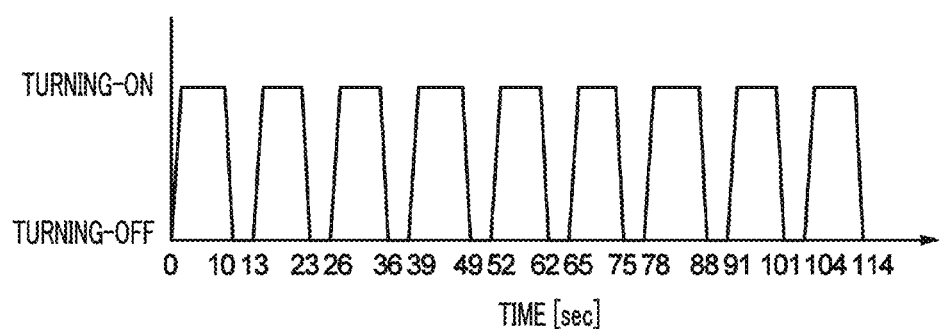
FIG. 23B is a graph showing a variation of turning-on and turning-off of the light source in the third experimental example.
Figure 24A:
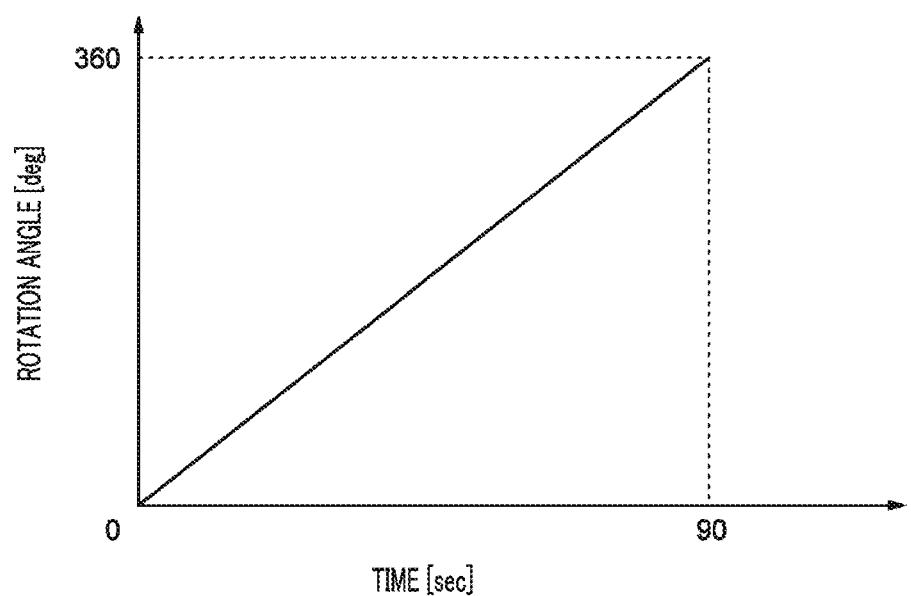
FIG. 24A is a graph showing a variation of a rotation angle of a wafer with a lapse of time in a comparative example.
Figure 24B:
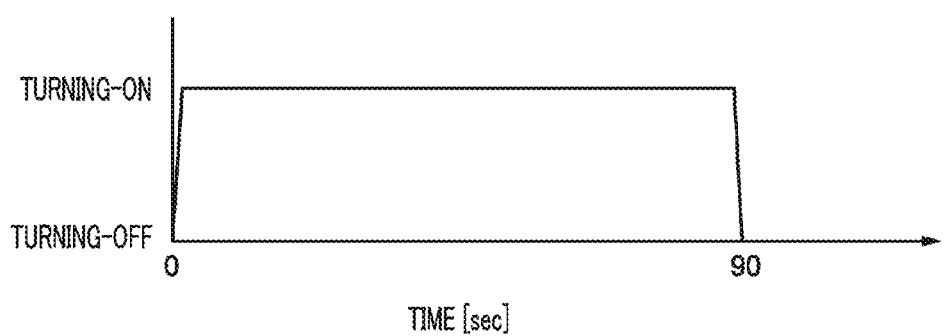
FIG. 24B is a graph showing a variation of turning-on and turning-off of the light source in the comparative example.

A disk-shaped wafer W having the protective film formed on the front surface Wa thereof is prepared, and the wafer W is subjected to the ashing processing in the ashing unit U2. In the ashing processing, the rotation of the wafer W and the turning-on/off of the light source 42 are controlled as shown in FIG. 23A and FIG. 23B. To elaborate, as depicted in FIG. 23A, a processing of rotating the wafer W one round for 10 sec and temporarily stopping the rotation of the wafer W for 3 sec is repeated until the wafer W is rotated nine rounds. Meanwhile, as depicted in FIG. 23B, the turning-on and the turning-off of the light source 42 are repeated according to this intermittent operation of the wafer W. Accordingly, the processing light from the light source 42 is irradiated to the wafer W for a total time length of 90 sec. Further, in the ashing processing, the heat plate 33 is controlled such that temperatures of all the heating regions 33a and 33b are substantially same Comparative Example A disk-shaped wafer W having the protective film formed on the front surface Wa thereof is prepared, and the wafer W is subjected to the ashing processing in the ashing unit U2. In the ashing processing, the rotation of the wafer W and the turning-on/off of the light source 42 are controlled as shown in FIG. 24A and FIG. 24B. To elaborate, as depicted in FIG. 24A, the wafer W is rotated one round for 90 sec. Meanwhile, as depicted in FIG. 24B, the turning-on and the turning-off of the light source 42 are repeated according to this intermittent operation of the wafer W. Accordingly, the processing light from the light source 42 is irradiated to the wafer W for a total time length of 90 sec. Further, in the ashing processing, the heat plate 33 is controlled such that temperatures of all the heating regions 33a and 33b are substantially same (Results)

To investigate the uniformity of the film removal amount by the ashing within the surface of the wafer, Range (%) is calculated for each of the experimental examples 1 to 3 and the comparative example. Here, the Range (%) is a value obtained by dividing a difference between a maximum value and a minimum value of the removing rate by the removing rate. The Range (%) of the experimental example 1 is 7.1. The Range (%) of the experimental example 2 is 6.3. The Range (%) of the experimental example 3 is 5.1. The Range (%) of the comparative example is 8.1. The Range (%) in each of the experimental examples 1 to 3 is smaller than that of the comparative example. As can be seen from this, according to the experimental examples 1 to 3, as compared to the comparative example, it is found out that the uniformity in the film removal amount by the aching within the surface of the wafer is improved.

Figure 25A:
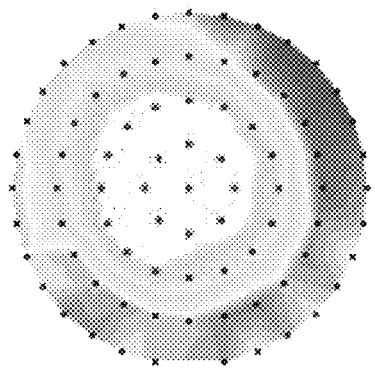
FIG. 25A is a diagram showing an in-surface distribution of a film removal amount in the first experimental example.
Figure 25B:
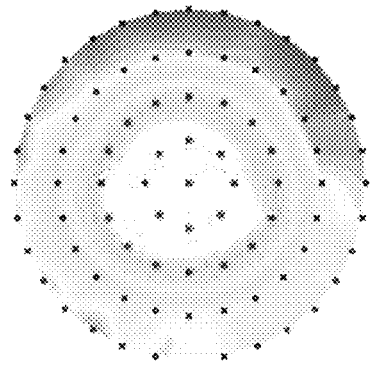
FIG. 25B is a diagram showing the in-surface distribution of the film removal amount in the second experimental example.
Figure 26A:
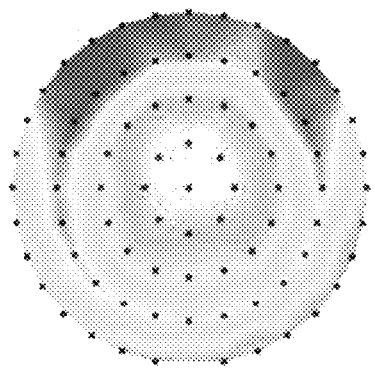
FIG. 26A is a diagram showing the in-surface distribution of the film removal amount in the third experimental example.
Figure 26B:
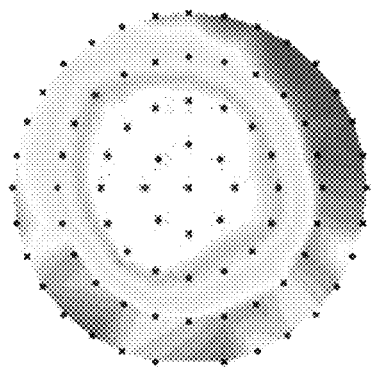
FIG. 26B is a diagram showing the in-surface distribution of the film removal amount in the comparative example.

Meanwhile, a distribution of the film removal amount within the surface of the wafer is measured for each of the experimental examples 1 to 3 and the comparative example. The distribution of the film removal amount within the surface of the wafer W in the experimental example 1 is shown in FIG. 25A. The distribution of the film removal amount within the surface of the wafer in experimental example 2 is shown in FIG. 25B. The distribution of the film removal amount within the surface of the wafer in the experimental example 3 is shown in FIG. 26A. The distribution of the film removal amount within the surface of the wafer in the comparative example is shown in FIG. 26B. In FIG. 25A to FIG. 26B, a bright portion indicates a small film removal amount, whereas a dark portion indicates a large film removal amount. Based on FIG. 25A to FIG. 26B, the uniformity in the film removal amount at a peripheral portion of each wafer W in a circumference direction is investigated. As a result, the experimental example 3 shows the highest uniformity; the experiment example 2, the second highest uniformity; the experimental example 1, the third highest uniformity; and the comparative example, the lowest uniformity. Thus, it is found out that the uniformity in the film removal amount at the periphery portion of the wafer W in the circumferential direction is improved according to the experimental examples 1 to 3, as compared to the comparative example.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting. The scope of the inventive concept is defined by the following claims and their equivalents rather than by the detailed description of the exemplary embodiments. It shall be understood that all modifications and embodiments conceived from the meaning and scope of the claims and their equivalents are included in the scope of the inventive concept.

We claim:

1. An ashing method, comprising:
a first process of irradiating, to a surface of a substrate having an organic film formed on the surface thereof, processing light for ashing the organic film from a light irradiating unit while changing a posture of the substrate with respect to the light irradiating unit from a first posture to a second posture; and
a second process of irradiating, after the first process, the processing light to the surface of the substrate from the light irradiating unit while changing the posture of the substrate with respect to the light irradiating unit from a third posture different from the first posture to a fourth posture.

2. The ashing method of claim 1,
wherein the substrate is rotated with respect to the light irradiating unit.

3. The ashing method of claim 2,
wherein a rotation number of the substrate in the first process is set to be in a range from 1 rpm to 100 rpm.

4. The ashing method of claim 1,
wherein a gap between the substrate and the light irradiating unit in the second process is set to be different from the gap between the substrate and the light irradiating unit in the first process.

5. The ashing method of claim 1, further comprising:
a third process of turning-on, when a preset time elapses after the processing light from the light irradiating unit is turned off or when a temperature of the light irradiating unit after the processing light from the light irradiating unit is turned off is equal to or less than a preset value, the light irradiating unit such that the processing light is not irradiated to the surface of the substrate, and then, irradiating the processing light to the surface of the substrate.

6. The ashing method of claim 5,
wherein the temperature of the light irradiating unit is a temperature of a member which receives light directly from a light source provided in the light irradiating unit.

7. A computer-readable recording medium having stored thereon computer-executable instructions that, in response to execution, cause an ashing apparatus to perform an ashing method as claimed in claim 1.

8. An ashing method, comprising:
a first process as an initial process of irradiating, to a surface of a substrate having an organic film formed on the surface thereof, processing light for ashing the organic film from a light irradiating unit while moving the substrate with respect to the light irradiating unit at a first speed; and
a second process as a subsequent process of irradiating, after the first process, the processing light to the surface of the substrate from the light irradiating unit while moving the substrate with respect to the light irradiating unit at a second speed lower than the first speed.

9. The ashing method of claim 8,
wherein the second process comprises:
irradiating the processing light to the surface of the substrate from the light irradiating unit while changing a posture of the substrate with respect to the light irradiating unit from a first posture to a second posture at the second speed; and
irradiating the processing light to the surface of the substrate from the light irradiating unit while changing the posture of the substrate with respect to the light irradiating unit from a third posture different from the first posture to a fourth posture at the second speed.

* * * * *

UNITED STATES PATENT AND TRADEMARK OFFICE
CERTIFICATE OF CORRECTION

PATENT NO.         : 11,049,739 B2                                      Page 1 of 1
APPLICATION NO.    : 16/260342
DATED              : June 29, 2021
INVENTOR(S)        : Kikai et al.

It is certified that error appears in the above-identified patent and that said Letters Patent is hereby corrected as shown below:

In the Specification

Column 2, Line 52, "ached" should be -- ashed --.

Column 3, Line 22, "ached" should be -- ashed --.

Column 8, Line 1, "aching" should be -- ashing --.

Column 9, Line 24, "aching" should be -- ashing --.

Column 9, Line 38, "ached" should be -- ashed --.

Column 9, Line 40, "aching" should be -- ashing --.

Column 11, Line 12, "aching" should be -- ashing --.

Column 12, Line 22, "[Aching Processing]" should be -- [Ashing Processing] --.

Column 14, Line 9, "ached" should be -- ashed --.

Column 15, Line 30, "ached" should be -- ashed --.

Column 17, Line 19, "aching" should be -- ashing --.

Column 19, Line 58, "aching" should be -- ashing --.

Signed and Sealed this
Twenty-fifth Day of January, 2022

Drew Hirshfeld
*Performing the Functions and Duties of the*
*Under Secretary of Commerce for Intellectual Property and*
*Director of the United States Patent and Trademark Office*